US009923069B1

(12) United States Patent
Kanomata et al.

(10) Patent No.: US 9,923,069 B1
(45) Date of Patent: Mar. 20, 2018

(54) NITRIDE SEMICONDUCTOR DEVICE

(71) Applicant: Panasonic Intellectual Property Management Co., Ltd., Osaka (JP)

(72) Inventors: Ryusuke Kanomata, Osaka (JP); Ayanori Ikoshi, Kyoto (JP); Hiroto Yamagiwa, Hyogo (JP); Saichirou Kaneko, Kyoto (JP); Manabu Yanagihara, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/445,358

(22) Filed: Feb. 28, 2017

(51) Int. Cl.
| | | |
|---|---|---|
| *H01L 29/739* | (2006.01) |
| *H01L 29/417* | (2006.01) |
| *H01L 29/20* | (2006.01) |
| *H01L 29/205* | (2006.01) |
| *H01L 29/778* | (2006.01) |
| *G01R 31/26* | (2014.01) |

(52) U.S. Cl.
CPC .... *H01L 29/41758* (2013.01); *G01R 31/2642* (2013.01); *H01L 29/2003* (2013.01); *H01L 29/205* (2013.01); *H01L 29/7787* (2013.01)

(58) Field of Classification Search
CPC .................................................. H01L 29/7783
USPC ....................................................... 257/195
See application file for complete search history.

(56) References Cited

U.S. PATENT DOCUMENTS

| 7,692,263 | B2 * | 4/2010 | Wu ...................... H01L 29/2003 257/367 |
| 8,587,031 | B2 * | 11/2013 | Lu ........................ H01L 29/7787 257/194 |
| 9,343,562 | B2 * | 5/2016 | Briere ................... H01L 29/778 |
| 2011/0215379 | A1 | 9/2011 | Ikoshi et al. |
| 2012/0032232 | A1 | 2/2012 | Iwabuchi et al. |
| 2013/0328107 | A1 | 12/2013 | Iwabuchi et al. |
| 2016/0035853 | A1 | 2/2016 | Kaneko et al. |
| 2016/0351676 | A1 | 12/2016 | Kaneko et al. |

FOREIGN PATENT DOCUMENTS

| JP | 2011-181743 A | 9/2011 |
| JP | 2012-018961 A | 1/2012 |
| JP | 2013-021361 A | 1/2013 |
| JP | 2013-038239 A | 2/2013 |
| JP | 2013-098222 A | 5/2013 |
| WO | 2014/174810 A1 | 10/2014 |

* cited by examiner

*Primary Examiner* — Chandra Chaudhari

(74) *Attorney, Agent, or Firm* — McDermott Will & Emery LLP

(57) ABSTRACT

A nitride semiconductor device includes: a stacked structure portion having an active region; first and second main electrodes extending in a first direction; and a lead-out line (second lead-out line) electrically connected to the second main electrode and extends to one side in the first direction. The first main electrode has a first tip at an end which is on the side to which the lead-out line extends. The second main electrode has a second tip at an end which is on the side to which the lead-out line extends, and has, at a second tip-side in the first direction, a tapered portion having a width in a second direction which decreases with decreasing distance to the second tip. The lead-out line has a region projecting in the second direction from the tapered portion, and the first tip does not project further in the first direction than the second tip.

13 Claims, 22 Drawing Sheets

FIRST
DIRECTION
⊗ → SECOND DIRECTION

NITRIDE SEMICONDUCTOR DEVICE

BACKGROUND

1. Technical Field

The present disclosure relates to nitride semiconductor devices, and particularly relates to a nitride semiconductor device such as a transistor or a diode used in an inverter, a power conditioner, a power supply circuit, etc.

2. Description of the Related Art

Recent years have seen active development of field effect transistors (FETs) as high-frequency, high-power devices using a gallium nitride (GaN)-based nitride semiconductor.

By using GaN and aluminum nitride (AlN) and indium nitride (InN) which are likewise nitride semiconductors, various mixed crystals can be created. A feature of the heterojunction of these nitride semiconductors is that a high-mobility, high-density two-dimensional electron gas (2 DEG) layer is generated in the junction interface by spontaneous polarization or piezoelectric polarization even without impurity doping. FETs and Schottky barrier diodes (SBDs) using such a 2 DEG layer as a carrier are attracting attention as high-frequency and high-power devices.

A GaN-FET using a 2 DEG layer is a horizontal device in which current flows in a horizontal direction with respect to the semiconductor substrate. In contrast, a power metal-oxide semiconductor (MOS) transistor and insulated gate bipolar transistor (IGBT) using the widely implemented Si semiconductor are vertical devices in which current flows in a perpendicular direction with respect to the semiconductor substrate. Unlike in a vertical device, in a horizontal device, the source electrode which is a grounding electrode and the drain electrode to which high voltage is applied are present in the same surface side, and thus high voltage is applied between a short distance. Therefore, the breakdown voltage design of the device requires more attention than in a vertical device. In addition, in the case of a GaN-FET using a 2 DEG layer, the 2 DEG layer is typically formed in the interface between a GaN channel layer which is not doped with impurities and an AlGaN layer which is formed above the GaN channel layer, is not doped with impurities, and has a thickness of approximately not less than 10 nm and not more than 100 nm. Therefore, in the GaN-FET, a large current flows in a region that is extremely shallow, that is, approximately not less than 10 nm and not more than 100 nm from the semiconductor surface. As such, for a power transistor (GaN power transistor) having a large gate width among GaN-FETs, device design for ensuring reliability such as head-dissipation design, design for uniform current flow, design which does not cause electric field concentration, etc., becomes important.

One big problem related to GaN-FET reliability is the phenomenon called current collapse in which electrons trapped in the semiconductor surface cause the number of channel electrons to decrease and the ON-resistance to increase. Thus far, as a method of suppressing such current collapse, there is disclosed a method of placing a hole injection electrode in a drain electrode periphery portion to form a structure that eliminates electrons that are trapped (International Publication No. WO2014/174810 (Patent Literature 1)).

Furthermore, as another problem related to GaN-FET reliability, it is reported that, compared to static OFF breakdown voltage, the dynamic breakdown voltage when 1 pulse of ON-pulse is supplied to a gate deteriorates greatly (Japanese Unexamined Patent Application Publication No. 2013-021361 (Patent Literature 2)). In Patent Literature 2, it is thought that the cause for the deterioration of dynamic breakdown voltage is current concentration at the tip portion of the drain electrode, and a structure in which current does not concentrate at the tip of the drain electrode is disclosed.

SUMMARY

The inventors performed a test of causing consecutive hard switching operation in order to check reliability assuming a state of prolonged actual usage of a GaN-FET. The test will be described using the drawings. FIG. 7 is a circuit diagram illustrating a configuration of a circuit used in the consecutive hard switching test of the GaN-FET. FIG. 8 is a graph illustrating loci of voltage and current applied to the GaN-FET in the continuous hard switching test. FIG. 8 illustrates loci of drain current and drain voltage in the GaN-FET switching operation. FIG. 9 is a plan view of the layout of the conventional GaN-FET used in the test.

As illustrated in FIG. 7, since inductance L is used as a load of the circuit, high-voltage and high-current are simultaneously applied to the GaN-FET at the time of switching. As such, as shown in the region surrounded by the dotted line in FIG. 8, a high voltage and a high current are simultaneously applied to the GaN-FET at turn on and at turn off.

As illustrated in FIG. 9, in the GaN-FET, source electrode 1011 and drain electrode 1005 are arranged alternately. Source electrode 1011 and drain electrode 1005 are connected to source electrode line 1012 and drain electrode line 1006, respectively. Furthermore, gate electrode 1010 is disposed between source electrode 1011 and drain electrode 1005. In addition, hole injection portion 1007 comprising p-GaN and an electrode is disposed around drain electrode 1005. At the time of switching in which a high voltage and a high current are simultaneously applied, holes are injected from hole injection portion 1007, electrons that would be trapped in the surrounding portion of drain electrode 1005 are eliminated, thus suppressing a current collapse.

After executing the consecutive hard switching using the GaN-FET, destruction of the GaN-FET occurred approximately 20 minutes after the start of the test. Checking the destroyed GaN-FET, it was confirmed that destruction occurred particularly at an area inside of electrode vicinity region 1030 which is closest to drain electrode 1005 (X-mark portion in FIG. 9). Here, electrode vicinity region 1030 is located in the vicinity of a portion of drain electrode line 1006 that sticks out (projects) from the tip of drain electrode 1005. Although the tip of drain electrode 1005 has an approximately semicircular shape in which the electrode width (width in the crosswise direction in FIG. 9) in order to mitigate electric field concentration, destruction occurred at the vicinity of the tip. As such, a conventional GaN-FET has a short lifespan and insufficient reliability.

In view of this, the present disclosure provides a nitride semiconductor device having a long lifespan and high reliability.

In order to solve the aforementioned problems, a nitride semiconductor device according to an aspect of the present disclosure includes: a substrate; a stacked structure portion including a first nitride semiconductor layer disposed above the substrate, and a second nitride semiconductor layer disposed above the first nitride semiconductor layer and having a band gap larger than a band gap of the first nitride semiconductor layer, the stacked structure portion having an active region in which two-dimensional electron gas is present, the two-dimensional electron gas being induced at an interface between the first nitride semiconductor layer and the second nitride semiconductor layer; a first main electrode disposed above the active region and extending in a first direction in a plan view of the substrate; a second main electrode disposed at a position which is above the active region and separated from the first main electrode in a second direction perpendicular to the first direction in the plan view of the substrate, the second main electrode extending in the first direction; and a lead-out line disposed above the second main electrode and electrically connected to the second main electrode, the lead-out line extending from a top of the second main electrode to one side in the first direction. The first main electrode has a first tip at an end in the first direction which is on the one side to which the lead-out line extends, and the second main electrode has a second tip at an end in the first direction which is on the one side to which the lead-out line extends, and has, at a second tip-side in the first direction, a tapered portion having a width in the second direction which decreases with decreasing distance to the second tip. The lead-out line has a region projecting in the second direction from the tapered portion in the plan view of the substrate, the region having a lower portion that is included in the active region, and the first tip does not project further in the first direction than the second tip.

According to an aspect of the present disclosure, it is possible to provide a nitride semiconductor device having a long lifespan and high reliability.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENT (Underlying Knowledge Forming Basis of the Present Disclosure)

Figure 8:
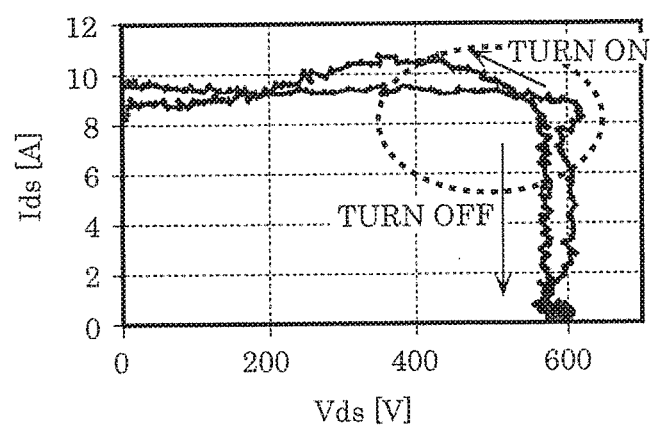
FIG. 8 is a graph illustrating loci of voltage and current applied to the GaN-FET in the continuous hard switching test.

In the GaN-FET continuous hard switching test, the inventors keenly examined the destruction occurring in the vicinity of the tip of the drain electrode. First, as a result of observing, during the test, the temperature and the ON-resistance of the GaN-FET on which the continuous hard switching test was being performed, a drastic rise in the temperature and ON-resistance immediately before destruction was not observed. Specifically, it was understood that current collapse such as that indicated in Patent Literature 1 did not occur in the GaN-FET. In addition, it was understood that the moment at which destruction occurred was at the time of turning ON or turning OFF, and not during the period in which the GaN-FET was ON or the period in which the GaN-FET was OFF. Specifically, it was understood that the destruction was a phenomenon that occurs when the high voltage and the high current indicated in the region surrounded by the dotted line in FIG. 8 are simultaneously applied to the GaN-FET.

From these observations, it was considered that if, during the flow of electrons from the source electrode to the drain electrode, high voltage is applied along the way from a drain electrode line which is the upper portion, a phenomenon occurs in which part of the flowing electrons are drawn to the drain electrode line that applied the high voltage, and shoot into a trap level present in the semiconductor surface instead of normally flowing to the drain electrode.

The phenomenon in which destruction occurs in the tip portion of the drain electrode according to this mechanism will be described using FIG. 9 and FIG. 10. FIG. 10 is a cross-sectional view of the conventional GaN-FET at cross-section 10-10 in FIG. 9.

As illustrated in FIG. 10, in the conventional GaN-FET, drain electrode 1005 and hole injection portion 1007 are formed on a stacked structure including GaN layer 1004 and AlGaN layer 1003. Electron current 1060 flowing from source electrode 1011 (see FIG. 9) to drain electrode 1005 is present at the junction interface of AlGaN layer 1003 and GaN layer 1004.

Furthermore, drain electrode line 1006 is formed on drain electrode 1005. Here, drain electrode line 1006 projects from drain electrode 1005 to the hole injection portion 1007-side to cover electrode vicinity region 1030.

Figure 9:
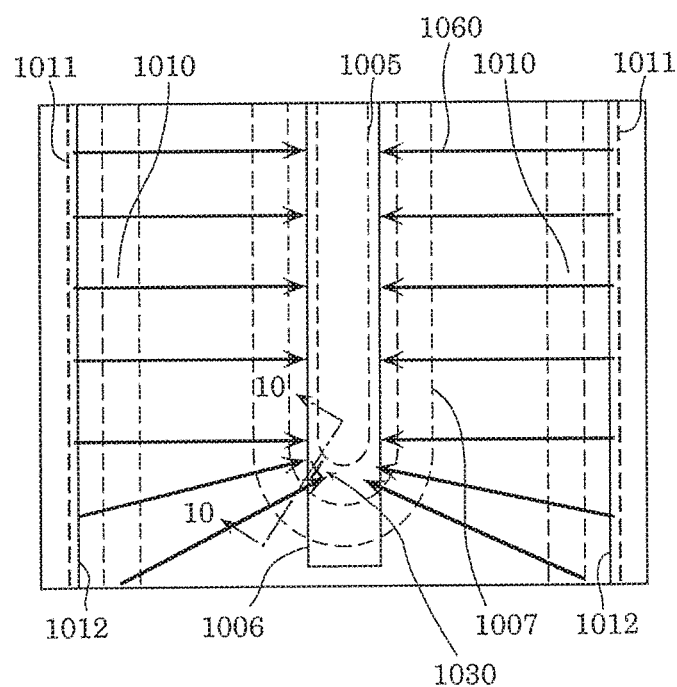
FIG. 9 is a plan view of a layout of the conventional GaN-FET used in the continuous hard switching test.
Figure 10:
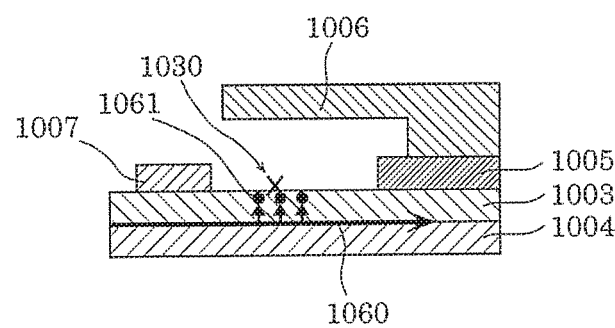
FIG. 10 is a cross-sectional view of the conventional GaN-FET at cross-section 10-10 in FIG. 9.

As illustrated in FIG. 9, the density of electron current 1060 flowing from source electrode 1011 to drain electrode 1005 is approximately uniform in an opposing region in which source electrode 1011 and drain electrode 1005 are located opposite each other. In contrast, when source electrode 1011 is longer than drain electrode 1005, electron current 1060 converges at the tip of drain electrode 1005, and thus the density of electron current 1060 in the vicinity of the tip of drain electrode 1005 becomes higher than at the aforementioned opposing region. In addition, the surface of AlGaN layer 1003 directly below drain electrode line 1006, which is electrode vicinity region 1030 of drain electrode 1005 is directly affected by the potential of drain electrode line 1006. As a result, when the high voltage and the high current indicated in the region surrounded by the dotted line in FIG. 8 are simultaneously applied, many of electrons 1061 are drawn to the surface of AlGaN layer 1003 whose potential has become high, and are trapped as illustrated in FIG. 10.

In other words, at the time of continuous hard switching operation, electrons 1061 that are trapped at the surface of electrode vicinity region 1030 directly below drain electrode line 1006, in electrode vicinity region 1030 of drain electrode 1005, gradually accumulate. It can be assumed that the potential at the surface of AlGaN layer 1003 formed by these trapped electrons 1061 and the potential of drain electrode 1005, drain electrode line 1006, or the 2 DEG layer at the vicinity of drain electrode 1005 separate at the time of switching, and insulation destruction occurs in AlGaN layer 1003 or in an insulating film (not illustrated) formed on AlGaN layer 1003. Merely placing hole injection portion 1007 such as that disclosed in Patent Literature 1 is insufficient as a countermeasure for the destruction caused by the electron trap in the vicinity of the tip of drain electrode 1005 and directly below drain electrode line 1006.

Furthermore, just a layout design which suppresses current concentration at the tip of the drain electrode such as that disclosed in Patent Literature 2 is also insufficient as a countermeasure for the destruction caused by the electron trap. In other words, the layout design of a GaN-FET including a source electrode, a drain electrode, a drain electrode line, and an active region in which a 2 DEG is present is important.

Based on the above-described underlying knowledge and observation, the inventors thought of a nitride semiconductor device according to the present disclosure which improves lifespan in continuous hard switching operation, by reducing electrons trapped in the finger-shaped (elongated) drain electrode tip.

Hereinafter, exemplary embodiments of the present disclosure will be described with reference to the drawings. It should be noted that each of the subsequently-described exemplary embodiments show a specific example of the present disclosure. Therefore, numerical values, shapes, materials, structural components, the arrangement and connection of the structural components, etc. indicated in the following exemplary embodiments are mere examples, and are not intended to limit the scope of the present disclosure. Therefore, among the structural components in the following exemplary embodiments, components not recited in any one of the independent claims which indicate the broadest concepts of the present disclosure are described as arbitrary structural components.

It should be noted that the respective figures are schematic diagrams and are not necessarily precise illustrations. Furthermore, in the respective figures, substantially identical components are assigned the same reference signs, and overlapping description is omitted or simplified.

Furthermore, in the present Specification, the terms "above" (or on) and "below" (or under) do not indicate upward (vertically upward) and downward (vertically downward) in absolute spatial perception, but are used as terms defined by relative positional relationships based on the stacking order of a stacked configuration. Furthermore, the terms "above" and "below" are applied, not only to the case where two structural components are disposed spaced apart with another structural component being present between the two structural components, but also to the case where the two structural components are disposed in direct contact with each other.

Embodiment 1

Hereinafter, a nitride semiconductor device according to Embodiment 1 will be described with reference to the drawings.

Figure 1A:
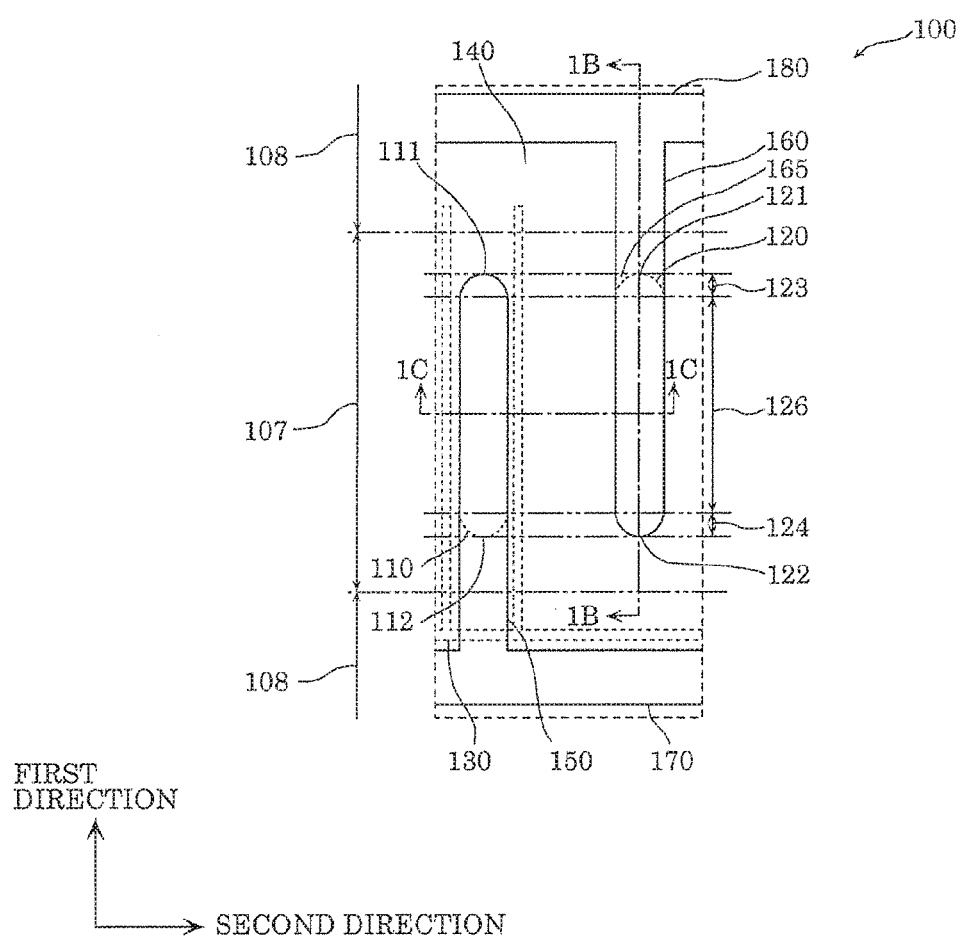
FIG. 1A is a plan view of a layout of a nitride semiconductor device according to Embodiment 1.
Figure 1B:
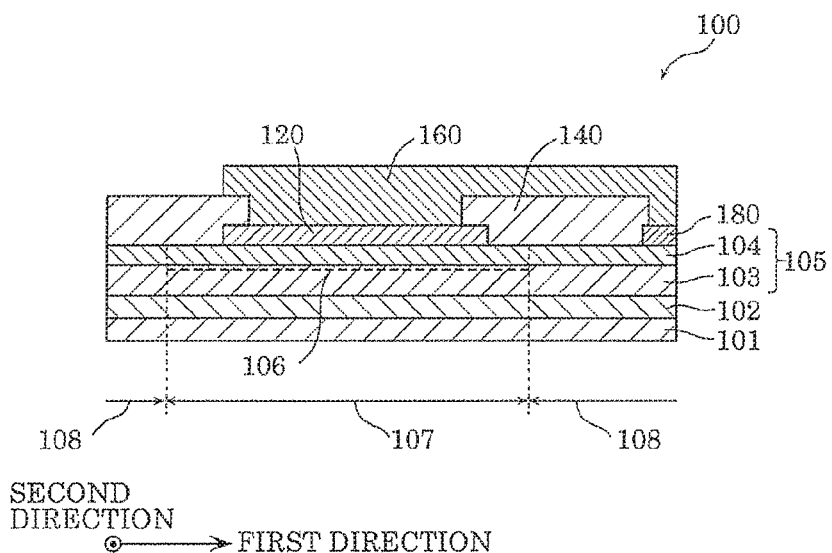
FIG. 1B is a cross-sectional view of the nitride semiconductor device according to Embodiment 1 at cross-section 1B-1B in FIG. 1A.
Figure 1C:
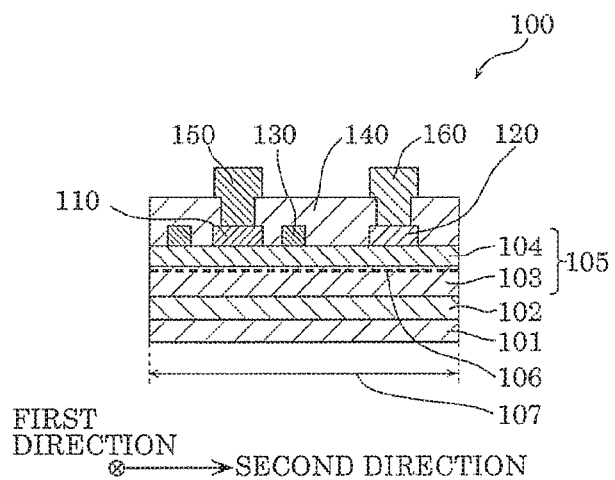
FIG. 1C is a cross-sectional view of the nitride semiconductor device according to Embodiment 1 at cross-section 1C-1C in FIG. 1A.

FIG. 1A is a plan view of a layout of nitride semiconductor device 100 according to this embodiment. FIG. 1B is a cross-sectional view of nitride semiconductor device 100 according to this embodiment at cross-section 1B-1B in FIG. 1A. FIG. 1C is a cross-sectional view of nitride semiconductor device 100 according to this embodiment at cross-section 1C-1C in FIG. 1A.

Hereinafter, the configuration of nitride semiconductor device 100 will be described using FIG. 1A to FIG. 1C.

Nitride semiconductor device 100 is a nitride semiconductor device using a nitride semiconductor and includes, as illustrated in FIG. 1C, substrate 101, buffer layer 102, stacked structure portion 105, first main electrode 110, second main electrode 120, control electrode 130, insulating film 140, first lead-out line 150, second lead-out line 160. Furthermore, as illustrated in FIG. 1A, nitride semiconductor device 100 further includes first integrating line 170, and second integrating line 180.

It should be noted that although the respective drawings indicate only one pair of first main electrode 110 and second main electrode 120 for the nitride semiconductor device according to this embodiment and each of the subsequent embodiments, each of the nitride semiconductor devices according to the respective embodiments has a repetitive structure in which a plurality of first main electrodes 110 and a plurality of second main electrodes 120 are disposed alternately.

Substrate 101 is the base of nitride semiconductor device 100, and the other structural components of nitride semiconductor device 100 are formed above substrate 101. The material forming substrate 101 is not particularly limited. In this embodiment, the material forming substrate 101 is silicon.

Buffer 102 is a layer disposed between substrate 101 and first nitride semiconductor layer 103, and reduces the lattice distortion of first nitride semiconductor layer 103 associated with the lattice mismatch between substrate 101 and first nitride semiconductor layer 103. The configuration of buffer layer 102 is not particularly limited as long as reduction of the lattice distortion of first nitride semiconductor layer 103 is possible. In this embodiment, buffer layer 102 is a multilayer structure including an AlN layer and an AlGaN layer. Buffer layer 102 may have a superlattice structure. Buffer layer 102 is, for example, formed by metal organic chemical vapor deposition (MOCVD).

Stacked structure portion 105 includes first nitride semiconductor layer 103 and second nitride semiconductor layer 104 stacked above first nitride semiconductor layer 103 and having a larger band gap than first nitride semiconductor layer 103.

First nitride semiconductor layer 103 is a nitride semiconductor layer disposed above substrate 101. In this embodiment, first nitride semiconductor layer 103 is stacked above substrate 101 via buffer layer 102. The configuration of first nitride semiconductor layer 103 is not particularly limited as long as it is a nitride semiconductor layer having a smaller band gap than second nitride semiconductor layer 104. In this embodiment, first nitride semiconductor layer 103 comprises a GaN layer with a thickness of approximately 2 μm.

Second nitride semiconductor layer 104 is a nitride semiconductor layer disposed above first nitride semiconductor layer 103 and having a larger band gap than first nitride semiconductor layer 103. The configuration of second nitride semiconductor layer 104 is not particularly limited as long as it is a nitride semiconductor layer having a larger band gap than first nitride semiconductor layer 103. In this embodiment, second nitride semiconductor layer 104 comprises an AlGaN layer with a thickness of approximately 50 nm.

First nitride semiconductor layer 103 and second nitride semiconductor layer 104 are, for example, formed by MOCVD.

As described above, in stacked structure portion 105, first nitride semiconductor layer 103 and second nitride semiconductor layer 104 are formed sequentially, that is, a stacked structure configured of an AlGan layer and a GaN layer is formed. Two-dimensional electron gas (2 DEG) 106 is formed in the interface of first nitride semiconductor layer 103 that is closer to second nitride semiconductor layer 104, due to the polarization effect and band gap difference occurring between the GaN layer and the AlGan layer. In this embodiment, as illustrated in FIG. 1A, stacked structure portion 105 has active region 107 in which two-dimensional electron gas 106 induced at the interface between first nitride semiconductor layer 103 and second nitride semiconductor layer 104 is present, and element separation regions 108 in which two-dimensional electron gas 106 is not present. Element separation regions 108 are formed by changing the two-dimensional electron gas into a high-resistance state by ion injection of He, B, Ar, etc. Furthermore, element separation regions 108 may be formed by removing second nitride semiconductor layer 104 composed of the AlGaN layer, through etching.

As illustrated in FIG. 1A, first main electrode 110 is an electrode disposed above active region 107 and extending in a first direction in a plan view of substrate 101. First main electrode 110 is, for example, a finger-shaped electrode configured of a stacked body including Ti, Al, etc.

Out of both end portions of first main electrode 110 in the first direction, first main electrode 110 has first tip 111 at the end portion that is on the side to which second lead-out line 160 extends (that is, the side which is opposite the side to which first lead-out line 150 extends), and has first opposite-side tip 112 at the end portion on the side to which first lead-out line 150 extends.

Second main electrode 120 is a finger-shaped electrode configured of a stacked body including Ti, Al, etc. In an OFF state, a higher voltage is applied to second main electrode 120 than to first main electrode 110. As illustrated in FIG. 1A, second main electrode 120 is disposed at a position which is above active region 107 and separated from first main electrode 110 in a second direction perpendicular to the first direction in a plan view of substrate 101. Second main electrode 120 extends in the first direction.

Second main electrode 120 has second tip 121 at the end portion in the first direction which is on the side to which second lead-out line 160 extends. In addition, second main electrode 120 has, on the second tip 121-side in the first direction, tapered portion 123 having a width in the second direction that decreases with decreasing distance to second tip 121. Furthermore, second main electrode 120 has second opposite-side tip 122 at the end portion in the first direction which is on a side opposite to the side to which second lead-out line 160 extends. In addition, second main electrode 120 has, on the second opposite-side tip 122-side in the first direction, tapered portion 124 having a width in the second direction that decreases with decreasing distance to second opposite-side tip 122. Stating the description regarding tapered portions 123 and 124 differently, second main electrode 120 has, at the end portions in the first direction, tapered portions 123 and 124 which are shaped in such a way that the electrode width (width in the second direction) successively narrows in a plan view of substrate 101.

Furthermore, second main electrode 120 has, in between both end portions in the first direction, same-width portion 126 in which the width in the second direction is the same.

First main electrode 110 and second main electrode 120 are, for example, formed by sputtering, etc., and are patterned using photolithography and dry etching.

Insulating film 140 is an electric insulating film formed above stacked structure portion 105. Insulating film 140 is thicker than first main electrode 110 and second main electrode 120, and has an opening occupying approximately an entire portion inward of the periphery of first main electrode 110 in a plan view of substrate 101. First main electrode 110 and first lead-out line 150 which is formed on insulating film 140 are electrically connected via this opening. Likewise, insulating film 140 has an opening occupying approximately an entire portion inward of the periphery of second main electrode 120 in a plan view of substrate 101. Second main electrode 120 and second lead-out line 160 which is formed on insulating film 140 are electrically connected via this opening. The material forming insulating film 140 is not particularly limited as long as it is electric insulating, and is, for example, SiN. Insulating film 140 is, for example, formed by chemical vapor deposition (CVD). Each of the openings of insulating film 140 are, for example, patterned by using photolithography and dry etching.

First lead-out line 150 is a lead-out line disposed above first main electrode 110 and electrically connected to first main electrode 110, and extends from the top of first main electrode 110 to one side (the bottom side in FIG. 1A) in the first direction. First lead-out line 150 extends from active region 107 up to one (the one at the bottom side in FIG. 1A) of element separation regions 108. First lead-out line 150 is electrically connected to first integrating line 170 formed in that element separation region 108.

Second lead-out line 160 is a lead-out line disposed above second main electrode 120 and electrically connected to second main electrode 120, and extends from the top of second main electrode 120 to one side (the top side in FIG. 1A) in the first direction. Second lead-out line 160 extends from active region 107 up to one (the one at the top side in FIG. 1A) of element separation regions 108. Second lead-out line 160 is electrically connected to second integrating line 180 formed in that element separation region 108.

The material forming first lead-out line 150 and second lead-out line 160 is not particularly limited as long as it is a conductive material. First lead-out line 150 and second lead-out line 160 are, for example, formed by sputtering, etc., using copper. Furthermore, first lead-out line 150 and second lead-out line 160 are, for example, patterned using photolithography and dry etching. Alternatively, first lead-out line 150 and second lead-out line 160 may be configured from Au using photolithography and electroplating.

Each of first integrating line 170 and second integrating line 180 is a line connected to a plurality of first lead-out lines 150 and a plurality of second lead-out lines 160, respectively, and extends in the second direction in a corresponding one of element separation regions 108. Each of first integrating line 170 and second integrating line 180 applies voltage to the plurality of first main electrodes 110 and the plurality of second main electrodes 120 via the plurality of first lead-out lines 150 and the plurality of second lead-out lines 160, respectively.

The material forming first integrating line 170 and second integrating line 180 is not particularly limited as long as it is a conductive material. First integrating line 170 and second integrating line 180 are, for example, formed by sputtering, etc., using copper. Furthermore, first integrating line 170 and second integrating line 180 are, for example, patterned using photolithography and dry etching. It should be noted that first integrating line 170 and second integrating line 180 may be formed at the same time as first lead-out line 150 and second lead-out line 160.

Control electrode 130 is an electrode which controls the amount of current flowing between first main electrode 110 and second main electrode 120. Control electrode 130 is disposed above active region 107, between first main electrode 110 and second main electrode 120. In this embodiment, as illustrated in FIG. 1A and FIG. 1C, control electrode 130 extends in the first direction at a position that is between first main electrode 110 and second main electrode 120 but more on the first main electrode 110-side than in the middle of first main electrode 110 and second main electrode 120. As illustrated in FIG. 1A, control electrode 130 is formed crossing active region 107 in the first direction in a top view of substrate 101. Control electrode 130 is, for example, configured of a stacked body including Ni, Pd, etc. Control electrode 130 is, for example, formed by sputtering, and is patterned using photolithography and dry etching. Furthermore, control electrode 130 may be formed by electron beam evaporation and lift-off.

Figure 1D:
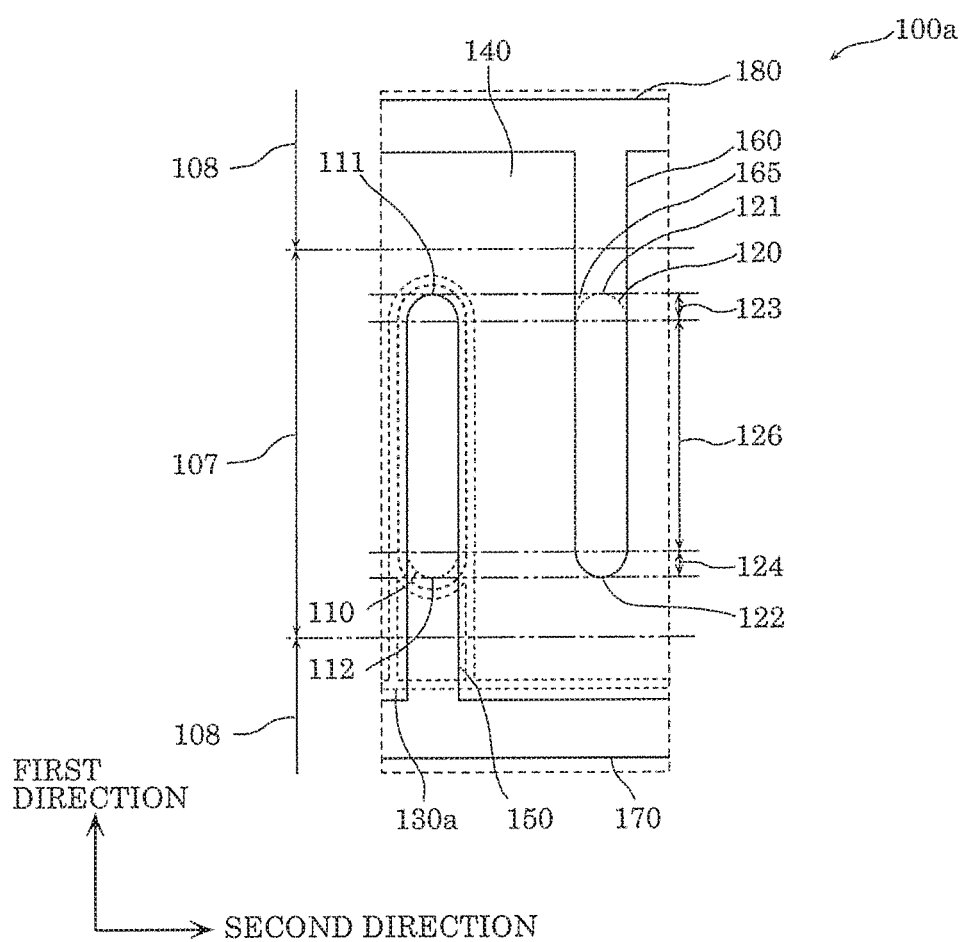
FIG. 1D is a plan view of a layout of a nitride semiconductor device including a control electrode having a different configuration from a control electrode according to Embodiment 1.

It should be noted that the configuration of the control electrode according to this embodiment is not limited to the configuration illustrated in FIG. 1A and may be another configuration. FIG. 1D is a plan view of the layout of nitride semiconductor device 100a including control electrode 130a having a configuration different from control electrode 130 according to this embodiment. Control electrode 130a illustrated in FIG. 1D may be formed to surround first main electrode 110.

Furthermore, although a normally ON transistor which conducts electricity even when bias voltage is not applied to control electrode 130 or 130a is assumed in this embodiment, nitride semiconductor device 100 may be a normally OFF transistor which does not conduct electricity when bias current is not applied to control electrode 130 or 130a may be assumed.

It should be noted that control electrode 130 or 130a may be an electrode configured of a stacked body including a p-type GaN layer and a metal layer including Ni, Pd, etc., above the p-type GaN layer. If p-type GaN is used, the 2 DEG depleting effect is big, and thus a normally ON transistor is easy to obtain.

As described above, first main electrode 110 has first tip 111 at the end portion in the first direction which is on the side to which second draw-out line 160 extends. Second main electrode 120 has second tip 121 at the end portion in the first direction which is on the side to which second draw-out line 160 extends. At this time, in this embodiment, first tip 111 does not project further in the first direction than second tip 121.

Figure 1E:
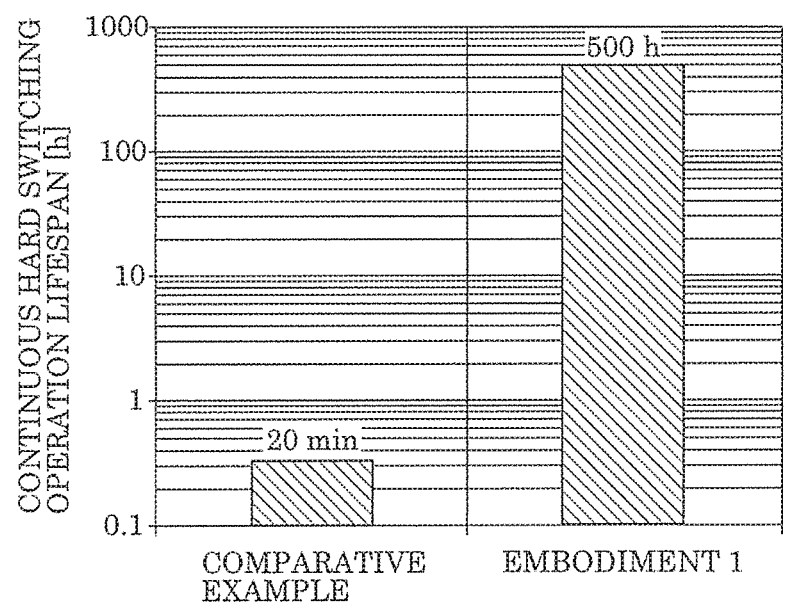
FIG. 1E is a graph illustrating continuous hard switching operation lifespans of the nitride semiconductor device according to Embodiment 1 and a nitride semiconductor device according to a comparative example.

The effects of nitride semiconductor device 100 according to this embodiment having the above-described configuration will be described using the figures below. FIG. 1E is a graph illustrating the continuous hard switching operation lifespan of nitride semiconductor device 100 according to this embodiment and a nitride semiconductor device according to a comparative example. In the continuous hard switching test illustrated in FIG. 1E, the nitride semiconductor device used as a comparative example has the same configuration as nitride semiconductor device 100 except for the point that first tip 111 projects further in the first direction than second tip 121.

Comparing the continuous hard switching test results between the comparative example and this embodiment, lifespan is 20 minutes (0.33 hour) for the comparative example compared to 500 hours for this embodiment, as illustrated in FIG. 1E. In other words, in nitride semiconductor device 100 according to this embodiment, it was verified that lifespan improved approximately 1500-fold by adopting a configuration in which first tip 111 does not project further in the first direction than second tip 121. This continuous hard switching test was performed under the accelerating condition of setting the current value and the voltage value higher than normal usage conditions. The 500-hour lifespan obtained in this test is equivalent to a lifespan of 100 years or more under normal usage conditions, and achieves the typical lifespan target value.

In addition, the destruction location in the nitride semiconductor device of the comparative example is at the tip portion of second main electrode 120, whereas the destruction location in nitride semiconductor device 100 according to this embodiment is a random position in same-width portion 126 of second main electrode 120. In other words, by adopting the configuration of nitride semiconductor device 100 according to this embodiment, the occurrence of destruction caused by the electron trap in the tip portion of second main electrode 120 such as that described using FIG. 9 and FIG. 10 was suppressed. As a result, in nitride semiconductor device 100 according to this embodiment, it is proven that suppressing the electron trap in the tip portion of second main electrode 120 significantly improves continuous hard switching lifespan.

As illustrated in FIG. 1A, in nitride semiconductor device 100 according to this embodiment where, in first main electrode 110 in the first direction, first tip 111 does not project further in the first direction than second tip 121, the electron current, having first main electrode 110 as a starting point, flows to second main electrode 120 opposite first main electrode 110 in the second direction, with a uniform electron current density in same-width portion 126 and a density less than or equal to the electron current density at same-width portion 126 in tapered portion 123. As a result, when the high voltage and the high current indicated by region surrounded by the dotted line in FIG. 8 are simultaneously applied, the flowing of an electron current having a density higher than the electron current density of same-width portion 126 immediately below second lead-out line 160 is eliminated, and thus it is considered that the electron trap in second nitride semiconductor layer 104 is suppressed. As a result, it is thought that destruction in the vicinity of second tip 121 has ceased to occur.

The configuration of the respective main electrodes of nitride semiconductor device 100 according to this embodiment is not limited to the configuration illustrated in FIG. 1A to FIG. 1C. Hereinafter, another example of the configuration of the respective main electrodes according to this embodiment will be described using the drawings.

Figure 1F:
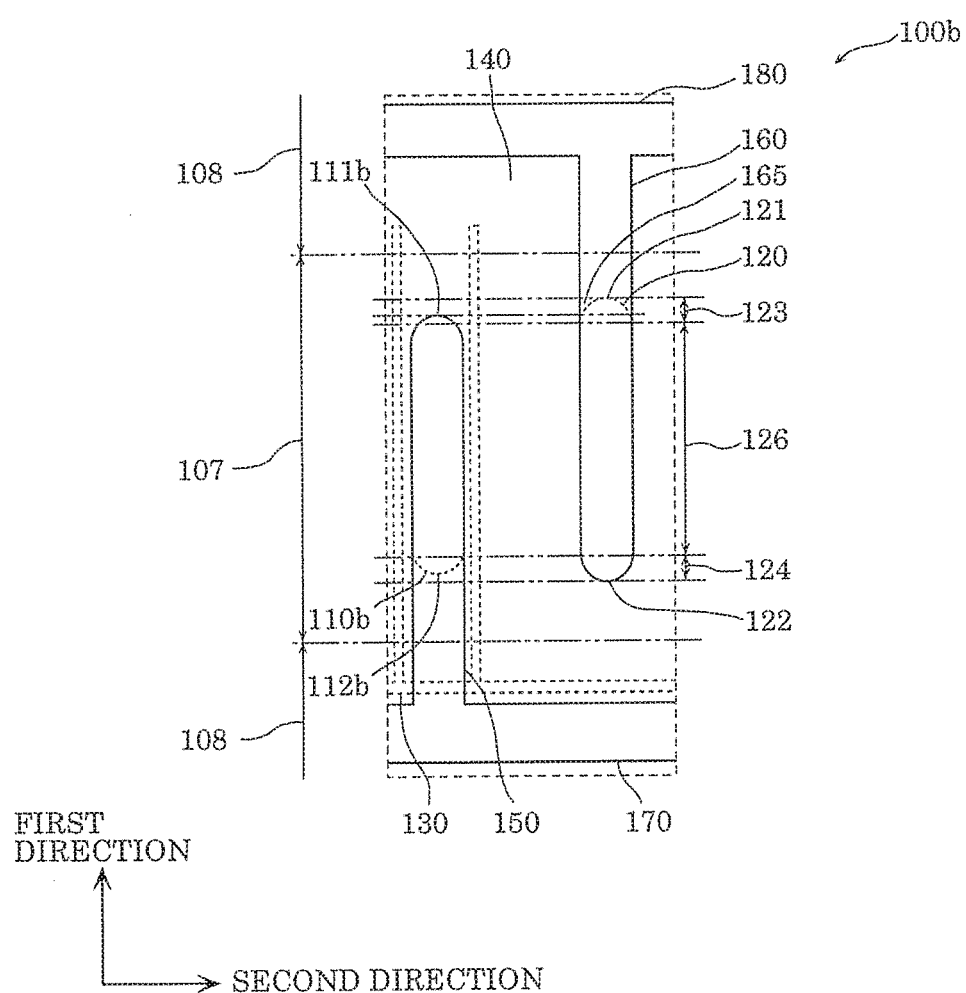
FIG. 1F is a plan view of another example configuration of a first main electrode according to Embodiment 1.
Figure 1G:
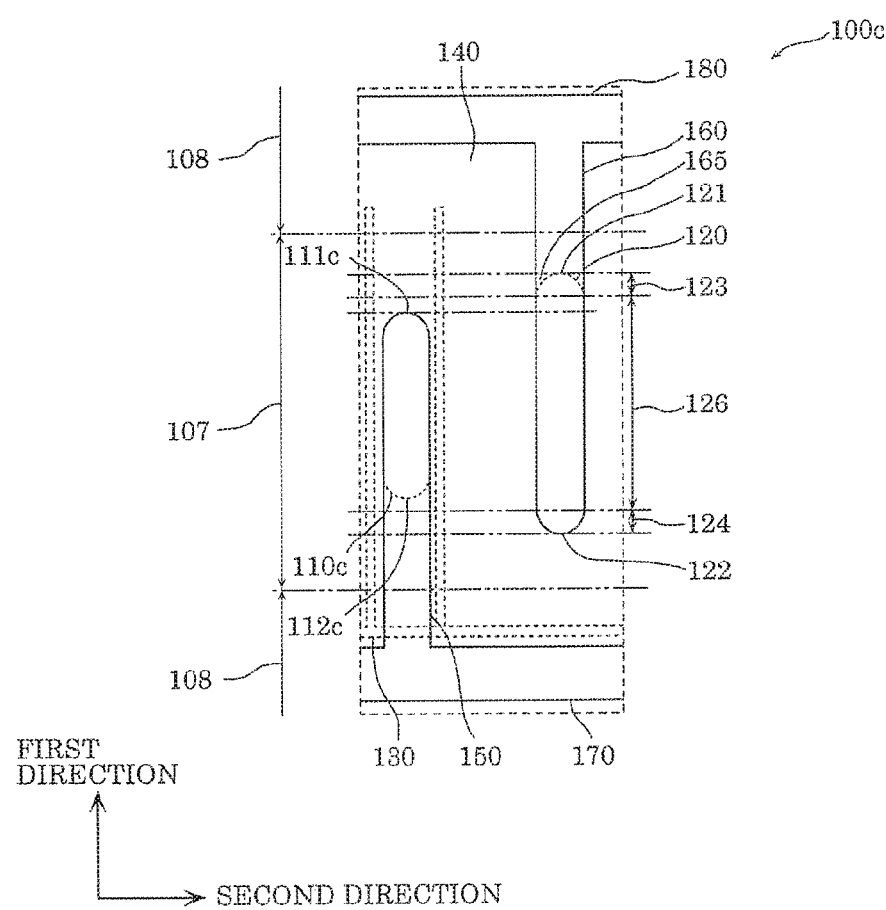
FIG. 1G is a plan view of yet another example configuration of a first main electrode according to Embodiment 1.

FIG. 1F is a plan view of another example configuration of the first main electrode according to this embodiment. FIG. 1G is a plan view of yet another example configuration of the first main electrode according to this embodiment.

As in nitride semiconductor device 100b including first main electrode 110b illustrated in FIG. 1F, second tip 121 may be formed to project further in the first direction than first tip 111b, and second opposite-side tip 122 may be formed to project further in the first direction than first opposite-side tip 112b. In this case, the electron current flowing directly below region 165 of second lead-out line 160 which extends in the second direction from tapered portion 123 of second main electrode 120 becomes smaller than in the case where first tip 111 is formed so as not to project further in the first direction than second tip 121 as illustrated in FIG. 1A. As such, in nitride semiconductor device 100b, the electron trap can be suppressed further than in nitride semiconductor device 100.

Furthermore, as in nitride semiconductor device 100c including first main electrode 110c illustrated in FIG. 1G, first tip 111c of first main electrode 110c may be formed so as not to project further in the first direction than the end of tapered portion 123 which is closer the center portion of second main electrode 120, and first opposite-side tip 112c may be formed so as not to project further in the first direction than the end of tapered portion 124 which is closer to the center portion of second main electrode 120. In this case, the electron current flowing from the tapered portion of second main electrode 120 to region 165 of second lead-out line 160 extending in the second direction becomes smaller than in the case where second tip 121 is formed to project further than first tip 111b, and second opposite-side tip 122 is formed to project further than first opposite-side tip 112b as illustrated in FIG. 1F. As such, in nitride semiconductor device 100c, the electron trap can be suppressed further than in nitride semiconductor device 100b.

It should be noted that, for example, the portion of second lead-out line 160 positioned above the portion of same-width portion 126 of second main electrode 120 which protrudes further in the first direction than first tip 111c does not project further in the second direction than the end portion of same-width portion 126 facing first main electrode 110. Likewise, for example, the portion of second lead-out line 160 positioned above the portion of same-width portion 126 of second main electrode 120 which protrudes further in the first direction than first opposite-side tip 112c does not project further in the second direction than the end portion of same-width portion 126 facing first main electrode 110c. In these cases, in the portion of a region directly above the 2 DEG which is located further toward the first main electrode 110c-side than same-width portion 126 of second main electrode 120, it is possible to avoid an electron trap caused by high voltage.

Furthermore, the portions of second lead-out line 160 whose position in the first direction coincides with tapered portions 123 and 124 may be formed so as not to project further toward the first main electrode 110-side in the second direction than same-width portion 126. In this case, in the portions of the region directly above the 2 DEG whose position in the first direction coincides with tapered portions 123 and 124 and whose position in the second direction is further toward the first main electrode 110c-side than same-width portion 126 of second main electrode 120, it is possible to avoid an electron trap caused by high voltage.

Furthermore, out of the portion of second lead-out line 160 that is positioned above active region 107, the portion located toward the second integrating electrode 180-side from second tip 121 may be formed so as not to project further toward the first main electrode 110-side in the second direction than same-width portion 126. In this case, it is possible to avoid an electron trap in the portion of second lead-out line 160 located toward second integrating line 180 from second tip 121 in the first direction and whose position in the second direction is coincides with same-width portion 126. Furthermore, the portion of second lead-out line 160 located above active region 107 may be formed so as not to project further in the first direction than second opposite-side tip 122.

Modification of Embodiment 1

Hereinafter, a nitride semiconductor device according to a modification of Embodiment 1 will be described with reference to the drawings.

Figure 1H:
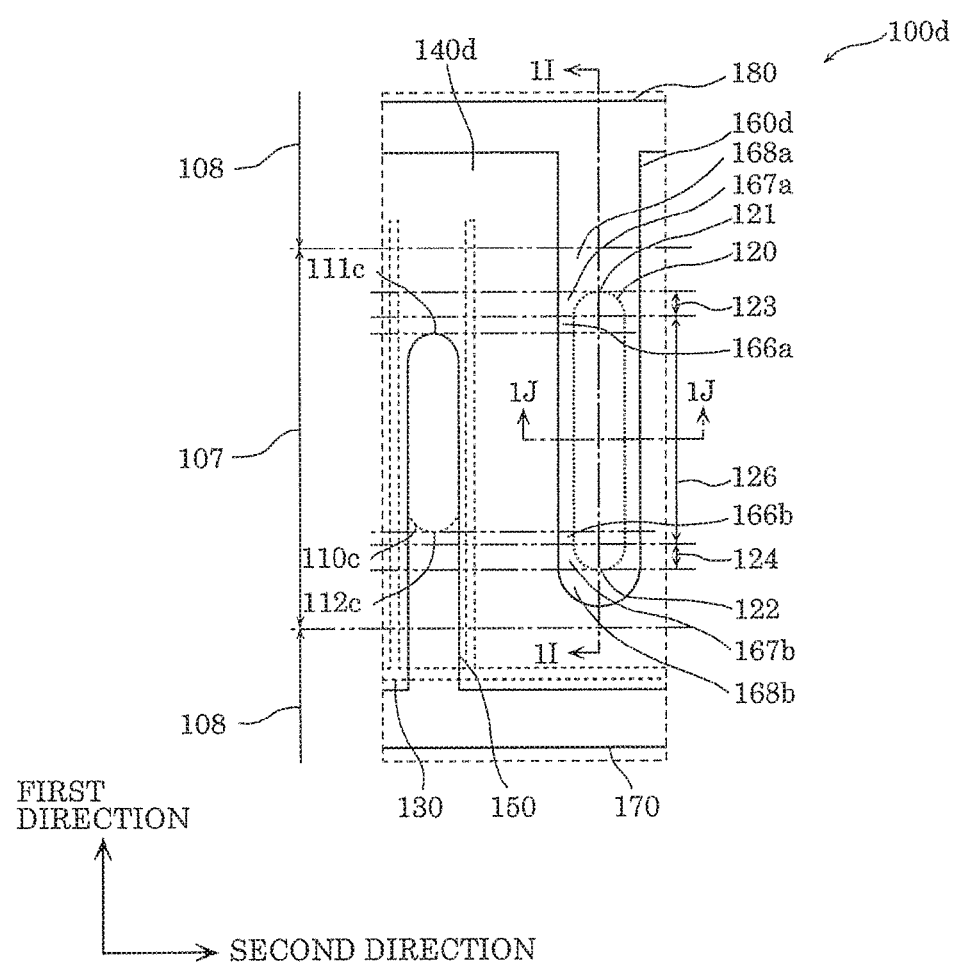
FIG. 1H is a plan view of a layout of a nitride semiconductor device according to a modification of Embodiment 1.
Figure 1I:
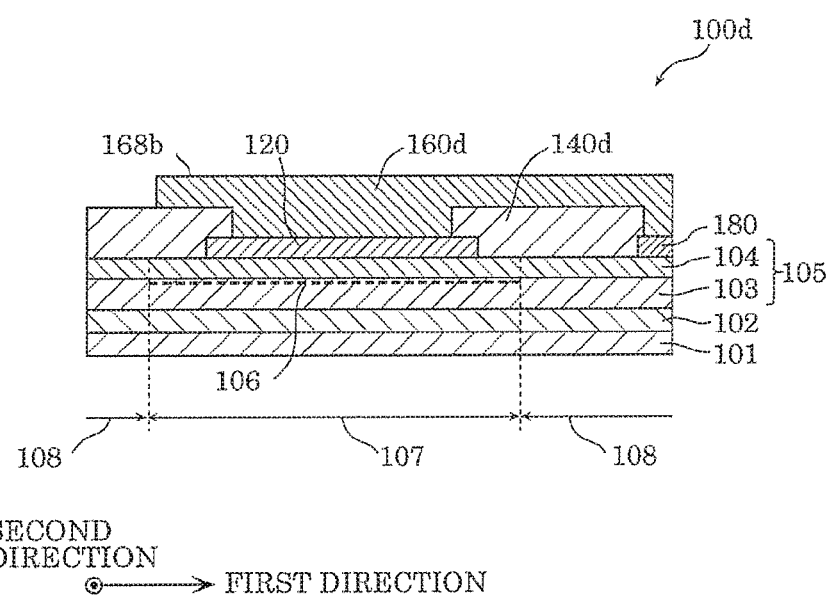
FIG. 1I is a cross-sectional view of the nitride semiconductor device according to the modification of Embodiment 1 at cross-section 1I-1I in FIG. 1H.
Figure 1J:
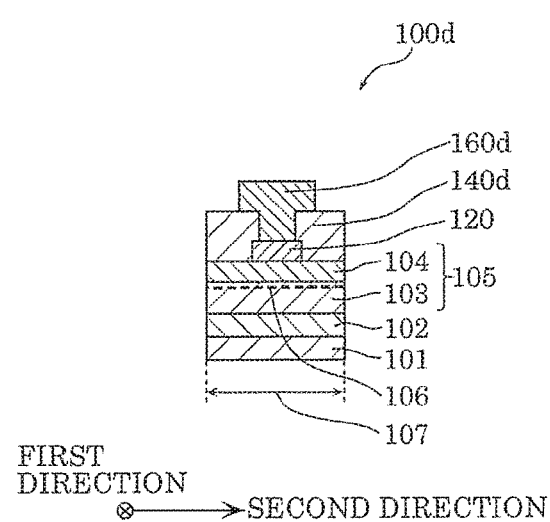
FIG. 1J is a cross-sectional view of the nitride semiconductor device according to the modification of Embodiment 1 at cross-section 1J-1J in FIG. 1H.

FIG. 1H is a plan view of a layout of nitride semiconductor device 100d according to this modification. FIG. 1I is a cross-sectional view of nitride semiconductor device 100d according to this modification at cross section 1I-1I in FIG. 1H. FIG. 1J is a cross-sectional view of nitride semiconductor device 100d according to this modification at cross section 1J-1J in FIG. 1H.

Since the configuration of nitride semiconductor device 100d according to this modification other than insulating film 140d and second lead-out line 160 is the same as the configuration of nitride semiconductor device 100c described above using FIG. 1G, overlapping description will be omitted. Furthermore, in this modification, the thickness of insulating film 140d needs to be increased so that the position of second lead-out line 160d does not cause an electron trap to occur at the surface of second nitride semiconductor layer 104. In the result of the study by the inventors, the thickness needs to be at least 2 μm when insulating film 140d comprises SiN (relative permittivity is 7.5). Since it is considered that the necessary insulating film thickness is proportional to relative permittivity, it is necessary, for example, for the thickness to be at least 1 μm when insulating film 140d comprises SiO2 (relative permittivity is 3.9), and for the thickness to be at least 0.9 μm when insulating film 140d comprises polyimide (relative permittivity is 3.5). In such a case, since insulating film 140d has sufficient thickness, the effect of the high voltage directly above 2 DEG can be disregarded.

As illustrated in FIG. 1H, at least a part of regions 166a and 166b of second lead-out line 160d which, in the first direction, do not project further than same-width portion 126 and project further than first main electrode 110, may project toward the first main electrode 110-side in the second direction. Stated differently, the portion (region 166a) of second lead-out line 160d positioned above the portion of same-width portion 126 which projects further in the first direction than first tip 111c may project in the second direction than same-width portion 126. Furthermore, the portion (region 166b) of second lead-out line 160d positioned above the portion of same-width portion 126 which projects further in the first direction than first opposite-side tip 112c may project in the second direction than same-width portion 126. In this case, second lead-out line 160d also functions as a drain field plate. Specifically, having second lead-out line 160d which has the same potential as second main electrode 120 project to the first main electrode 110-side in the second direction causes part of the line of electric force heading from the first main electrode 110-side to the second main electrode 120-side to head toward second lead-out line 160d, and thus it is possible to mitigate the electric field concentration in the first main electrode 110-side end portion of second main electrode 120. With this, the destruction of the end portion of second main electrode 120 can be suppressed.

It should be noted that, as illustrated in FIG. 1H, regions 167a and 167b of second lead-out line 160d whose positions in the first direction coincide with tapered portions 123 and 124 may project further to the first main electrode 110-side in the second direction than same-width portion 126. In this case, since the projecting portions of second lead-out line 160d function as drain field plates, it is possible to obtain an electric field mitigating effect in the first main electrode 110-side end portion of second main electrode 120. With this, the destruction of the end portion of second main electrode 120 can be suppressed.

Furthermore, as illustrated in FIG. 1H, in Embodiment 1, out of the portion of second lead-out line 160d that is positioned above active region 107, region 168a extending from second tip 121 in a direction away from second main electrode 120 (upward in FIG. 1H) may be formed to project further toward the first main electrode 110-side in the second direction than same-width portion 126. Furthermore, as illustrated in FIG. 1H and FIG. 1I, out of the portion of second lead-out line 160d that is positioned above active region 107, region 168b extending from second opposite-side tip 122 in a direction away from second main electrode 120 (downward in FIG. 1H) may be formed to project further toward the first main electrode 110-side in the second direction than same-width portion 126. By adopting such a configuration, since the respective regions of second lead-out line 160d which project further than second main electrode 120 function as drain field plates, it is possible to obtain an electric field mitigating effect in the first main electrode 110-side end portion of second main electrode 120. With this, the destruction of the end portion of second main electrode 120 can be prevented.

Embodiment 2

Hereinafter, a nitride semiconductor device according to Embodiment 2 will be described. The nitride semiconductor device according to this embodiment is different from nitride semiconductor device 100 according to Embodiment 1 in the point of including hole injection portions for reducing electrons trapped in the surface of stacked structure portion 105. Hereinafter, the nitride semiconductor device according to this embodiment will be described with reference to the drawings, centering on the points of difference with nitride semiconductor device 100 according to Embodiment 1.

Figure 2A:
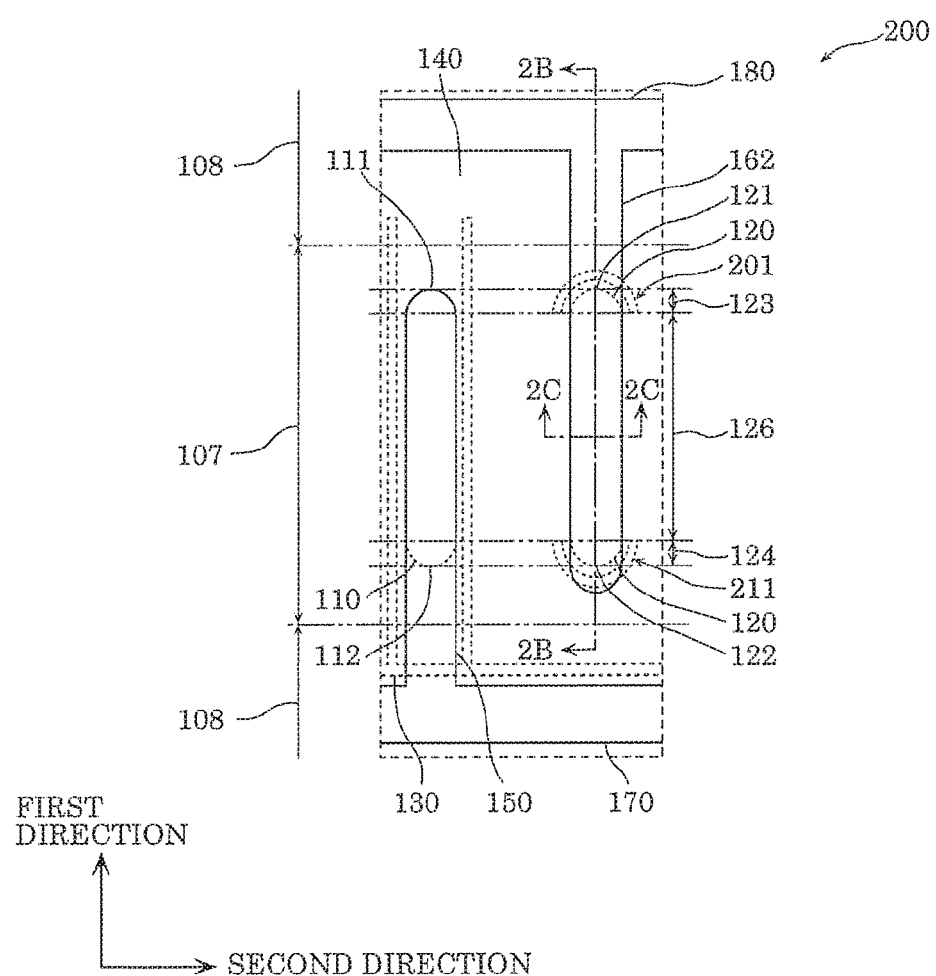
FIG. 2A is a plan view of a layout of a nitride semiconductor device according to Embodiment 2.
Figure 2B:
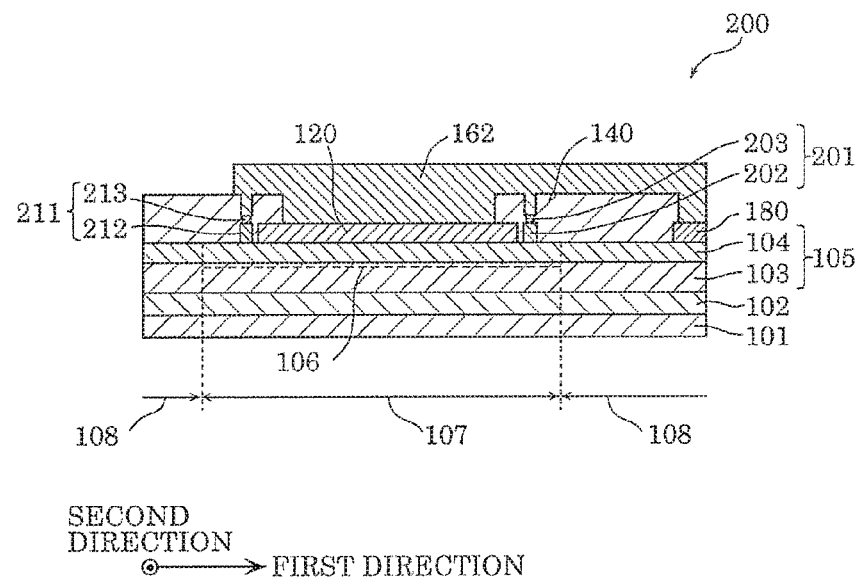
FIG. 2B is a cross-sectional view of the nitride semiconductor device according to Embodiment 2 at cross-section 2B-2B in FIG. 2A.
Figure 2C:
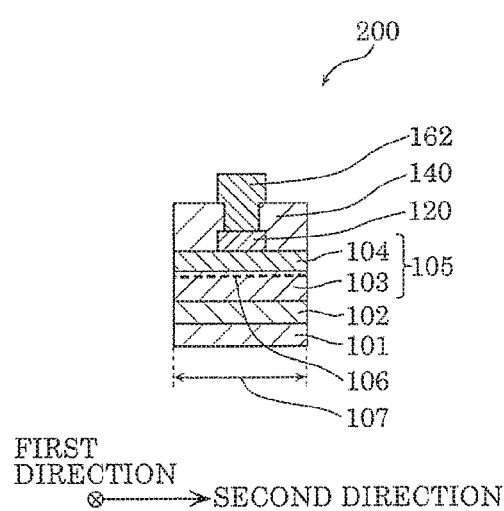
FIG. 2C is a cross-sectional view of the nitride semiconductor device according to Embodiment 2 at cross-section 2C-2C in FIG. 2A.

FIG. 2A is a plan view of a layout of nitride semiconductor device 200 according to this embodiment. Furthermore, FIG. 2B is a cross-sectional view of nitride semiconductor device 200 according to this embodiment at cross-section 2B-2B in FIG. 2A. FIG. 2C is a cross-sectional view of nitride semiconductor device 200 according to this embodiment at cross-section 2C-2C in FIG. 2A.

As illustrated in FIG. 2A to FIG. 2C, nitride semiconductor device 200 according to this embodiment includes, in the same manner as nitride semiconductor device 100, substrate 101, buffer 102, stacked structure portion 105, first main electrode 110, second main electrode 120, control electrode 130, insulating film 140, first lead-out line 150, second lead-out line 162, first integrating line 170, and second integrating line 180. As illustrated in FIG. 2A and FIG. 2B, nitride semiconductor device 200 further includes above active region 107 and in the vicinity of second main electrode 120, hole injection portions 201 and 211 which inject holes into stacked structure portion 105

Hole injection portions 201 and 211 are disposed in the vicinity of second main electrode 120 between first main electrode 110 and second main electrode 120. Here, vicinity of second main electrode 120 means that, as described later, the distance from second main electrode 120 to the edges of hole injection portions 201 and 211 near second main electrode 120 is within 1 μm. As illustrated in FIG. 2B, hole injection portion 201 is configured of both the p-type third nitride semiconductor layer 202 formed at a predetermined position above second nitride semiconductor layer 104, and hole injection electrode 203 formed above third nitride semiconductor layer 202. Likewise, hole injection portion 211 is configured of both the p-type third nitride semiconductor layer 212 formed at a predetermined position above second nitride semiconductor layer 104, and hole injection electrode 213 formed above third nitride semiconductor layer 212. It should be noted that hole injection portions 201 and 211 may respectively be configured of only the p-type third nitride semiconductor layers 202 and 212 formed at predetermined positions above second nitride semiconductor layer 104.

Third nitride semiconductor layers 202 and 213 are for example GaN layers doped with Mg. The density of Mg is approximately $1\times10^{19}$ cm$^{-3}$, and the carrier density is approximately $1\times10^{18}$ cm$^{-3}$. Third nitride semiconductor layers 202 and 213 are, for example, formed by MOCVD, and patterned using photolithography and dry etching.

Hole injection electrodes 203 and 213 are, for example, configured of a stacked body including Ni, Pd, Al, etc., and are in ohmic contact with third nitride semiconductor layers 202 and 213, respectively. Hole injection electrodes 203 and 213 are formed in a lower layer than insulating film 140. Insulating film 140 has openings (not illustrated) in at least part of portions above hole injection electrodes 203 and 213 that are formed, and at least part of the upper face of each of hole injection electrodes 203 and 213 are connected to second lead-out line 160 via these holes. Hole injection electrodes 203 and 213 are, for example, formed by sputtering, and are patterned using photolithography and dry etching.

Hole injection portion 211 on the second opposite-side tip 122-side is formed to be positioned closer to the second main electrode 120-side than the end portion of second lead-out line 162 in the first direction is.

In nitride semiconductor device 200 having the above-described configuration, when high voltage is applied to second lead-out line 162, that is, second main electrode 120 and hole injection portions 201 and 211, holes are injected into stacked structure portion 105 from hole injection portions 201 and 211, and thus electrons trapped in the surface level, etc., of stacked structure portion 105 are eliminated by recombining with the holes. In this manner, by forming hole injection portions 201 and 211, trapped electrons can be reduced. As a result, continuous hard switching lifespan can be improved further than in Embodiment 1.

The positional relationship between above-described hole injection portions 201 and 211 and second lead-out line 162 will be described using the drawings.

Figure 2D:
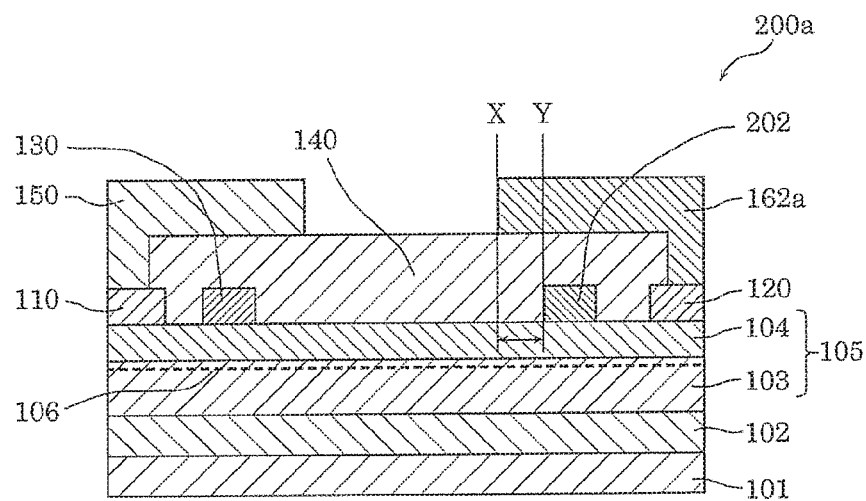
FIG. 2D is a cross-sectional view of the nitride semiconductor device perpendicular to a first direction, used for examining the appropriate positional relationship between hole injection portions and a second lead-out line according to this embodiment.
Figure 2E:
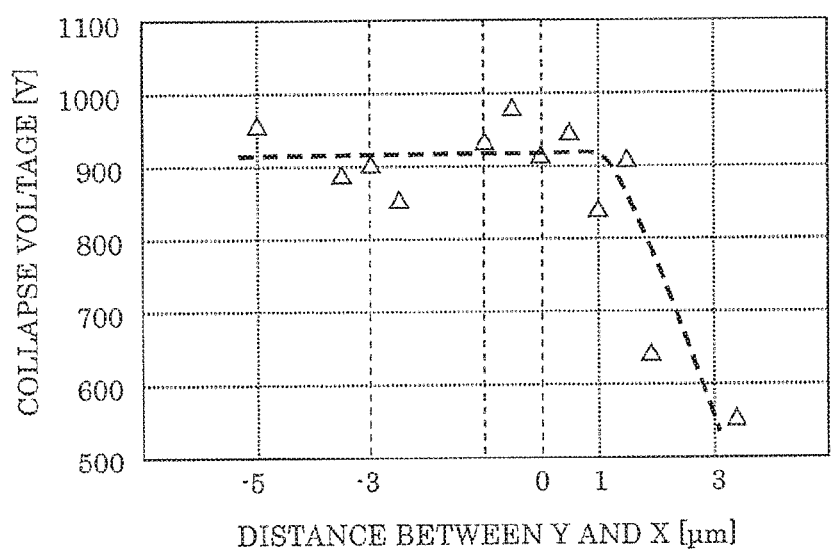
FIG. 2E is a graph illustrating the relationship between the distance between X and Y and the voltage at which a current collapse phenomenon occurs.

FIG. 2D is a cross-sectional view of nitride semiconductor device 200a perpendicular to the first direction, used for examining the appropriate positional relationship between hole injection portions 201 and 211 and second lead-out line 162 according to this embodiment. The distance between X and Y in FIG. 2D indicates the distance in the second direction between the first lead-out line 150-side edge of second lead-out line 162a and the edge of hole injection portion 201 (third nitride semiconductor layer 202) which is far from second main electrode 120. FIG. 2E is a graph illustrating the relationship between the distance between X and Y and the voltage at which the current collapse phenomenon occurs. It should be noted that, in FIG. 2E, the distance between X and Y when the edge of third nitride semiconductor layer 202 which is far from second main electrode 120 is farther from second main electrode 120 than the edge of second lead-out line 162a is indicated by a negative value.

As can be understood from FIG. 2E, a collapse voltage of at least 900 V is obtained when the distance between X and Y is at most 1 µm. In contrast, when the distance between X and Y exceeds 3 µm, the voltage at which the current collapse phenomenon occurs falls drastically. From this result, it is proven that in order for hole injection portions 201 and 211 to cause the trapped electrons to decrease, the distance between the edge of second lead-out line 162 and the edges of hole injection portions 201 and 211 which are far from second main electrode 120 needs to be within 1 µm. From this result, it can be estimated that holes scatter up to approximately 1 µm in a horizontal direction (first direction and second direction) from hole injection portions 201 and 211.

Applying this result to this embodiment, hole injection portions 201 and 211 are, for example, formed so that the edge which is near second main electrode 120 is within 1 µm from tapered portions 123 and 124, respectively.

Embodiment 3

Hereinafter, a nitride semiconductor device according to Embodiment 3 will be described. The nitride semiconductor device according to this embodiment is different from nitride semiconductor device 200 according to Embodiment 2 in the point that the hole injection portion surrounds second main electrode 120. Hereinafter, the nitride semiconductor device according to this embodiment will be described with reference to the drawings, centering on the points of difference with nitride semiconductor device 200 according to Embodiment 2.

Figure 3A:
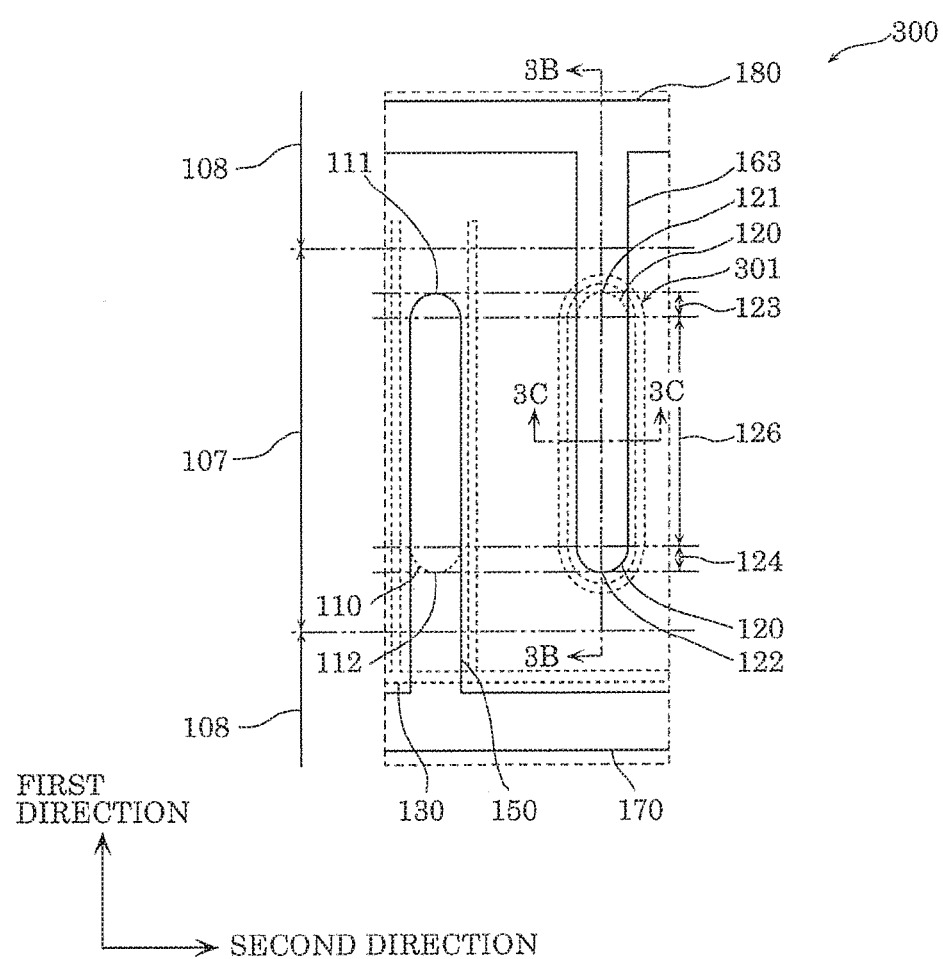
FIG. 3A is a plan view of a layout of a nitride semiconductor device according to Embodiment 3.
Figure 3B:
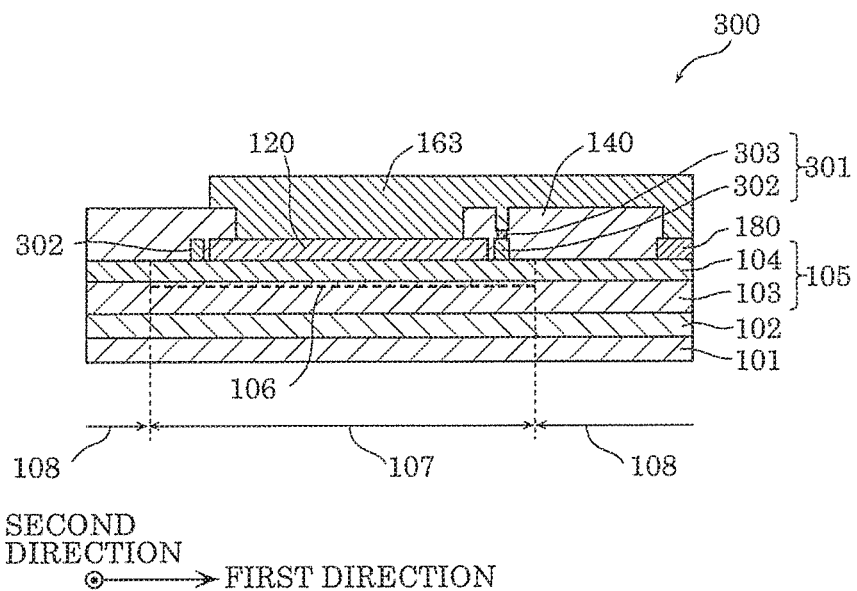
FIG. 3B is a cross-sectional view of the nitride semiconductor device according to Embodiment 3 at cross-section 3B-3B in FIG. 3A.
Figure 3C:
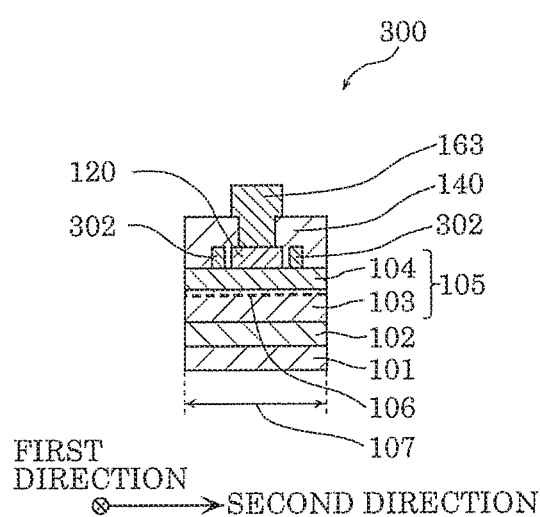
FIG. 3C is a cross-sectional view of the nitride semiconductor device according to Embodiment 3 at cross-section 3C-3C in FIG. 3A.

FIG. 3A is a plan view of a layout of nitride semiconductor device 300 according to this embodiment. FIG. 3B is a cross-sectional view of nitride semiconductor device 300 according to this embodiment at cross-section 3B-3B in FIG. 3A. FIG. 3C is a cross-sectional view of nitride semiconductor device 300 according to this embodiment at cross-section 3C-3C in FIG. 3A.

Nitride semiconductor device 300 according to this embodiment includes hole injection portion 301 as in nitride semiconductor device 200 according to Embodiment 2.

Hole injection portion 301 is disposed in the vicinity of second main electrode 120 between first main electrode 110 and second main electrode 120. Hole injection portion 301 is configured of both the p-type third nitride semiconductor layer 302 formed at a predetermined position above second nitride semiconductor layer 104, and hole injection electrode 303 formed above third nitride semiconductor layer 302. It should be noted that hole injection portion 301 may be configured of only the p-type third nitride semiconductor layer 302 formed at a predetermined position above second nitride semiconductor layer 104. Third nitride semiconductor layer 302 and hole injection electrode 303 have the same configuration as third nitride semiconductor layer 202 and hole injection electrode 203 according to Embodiment 2, respectively.

As illustrated in FIG. 3A to FIG. 3C, hole injection portion 301 surrounds second main electrode 120. More specifically, as illustrated in FIG. 3A, in a plan view of substrate 101, hole injection portion 301 surrounds the entirety of second main electrode 120 in the vicinity of second main electrode 120. Furthermore, although the connection configuration between second lead-out line 163 and hole injection portion 301 is not particularly limited, in this embodiment, second lead-out line 163 is connected to hole injection portion 301 at only one location as illustrated in FIG. 3B and FIG. 3C. In nitride semiconductor device 300 having the above-described configuration, the contact area between hole injection portion 301 and stacked structure portion 105 is increased and hole injection is carried out over the entirety of second main electrode 120, and thus trapped electrons can be further reduced compared nitride semiconductor device 200 according to Embodiment 2.

In addition, as previously described, the width of second lead-out line 163 in the second direction can be widened by up to 1 μm from the edge of hole injection portion 301 which is far from second main electrode 120 without causing the collapse voltage to decrease. As such, there is also the effect of being able to lower the resistance of second lead-out line 163.

Embodiment 4

Hereinafter, a nitride semiconductor device according to Embodiment 4 will be described. The nitride semiconductor device according to this embodiment is different from nitride semiconductor device 300 according to Embodiment 3 in the configuration of the hole injection portion. Hereinafter, the nitride semiconductor device according to this embodiment will be described with reference to the drawings, centering on the points of difference with nitride semiconductor device 300 according to Embodiment 3.

Figure 4A:
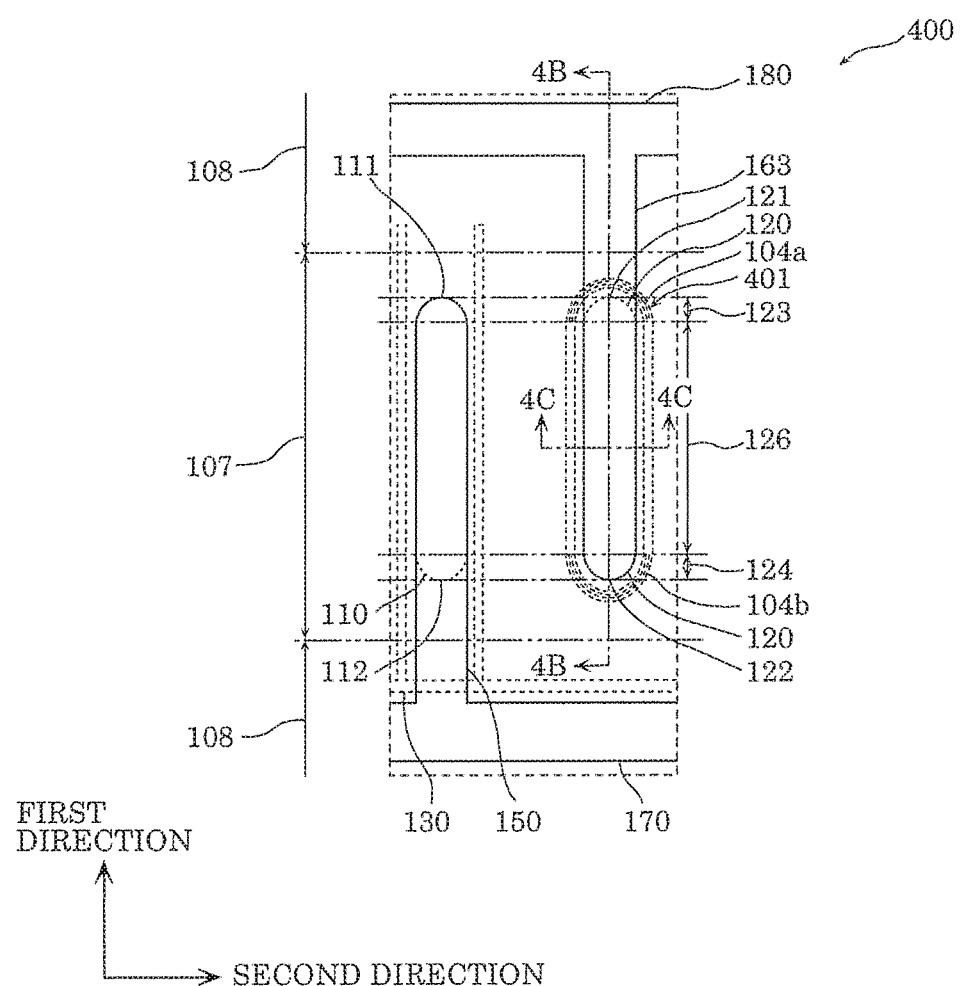
FIG. 4A is a plan view of a layout of a nitride semiconductor device according to Embodiment 4.
Figure 4B:
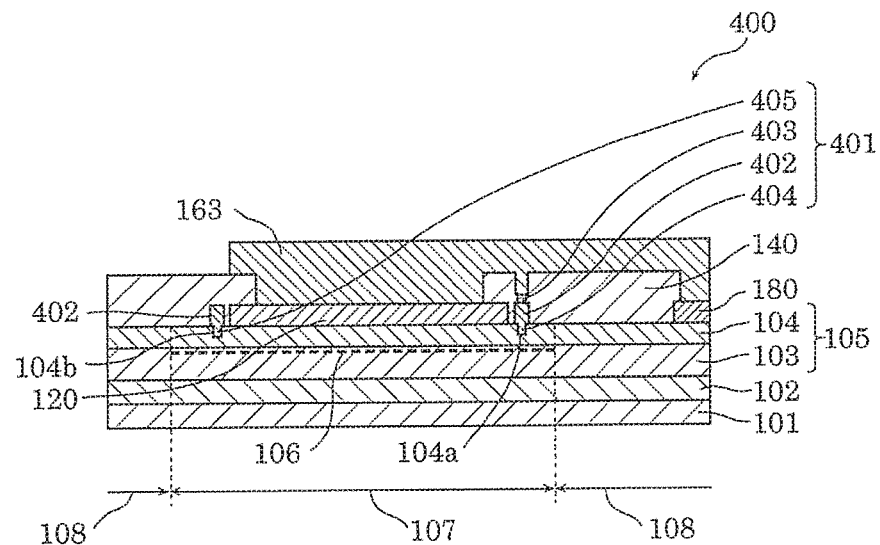
FIG. 4B is a cross-sectional view of the nitride semiconductor device according to Embodiment 4 at cross-section 4B-4B in FIG. 4A.
Figure 4C:
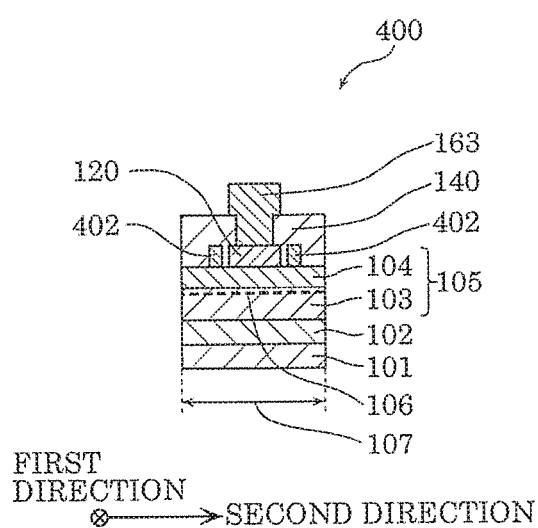
FIG. 4C is a cross-sectional view of the nitride semiconductor device according to Embodiment 4 at cross-section 4C-4C in FIG. 4A.

FIG. 4A is a plan view of a layout of nitride semiconductor device 400 according to this embodiment. FIG. 4B is a cross-sectional view of nitride semiconductor device 400 according to this embodiment at cross-section 4B-4B in FIG. 4A. FIG. 4C is a cross-sectional view of nitride semiconductor device 400 according to this embodiment at cross-section 4C-4C in FIG. 4A.

Nitride semiconductor device 400 according to this embodiment includes hole injection portion 401 surrounding second main electrode 120 in the same manner as nitride semiconductor device 300 according to Embodiment 3.

Hole injection portion 401 is disposed in the vicinity of second main electrode 120 between first main electrode 110 and second main electrode 120. Hole injection portion 401 is configured of both the p-type third nitride semiconductor layer 402 formed at a predetermined position above second nitride semiconductor layer 104, and hole injection electrode 403 formed above third nitride semiconductor layer 402. It should be noted that hole injection portion 401 may be configured of only the p-type third nitride semiconductor layer 402 formed at a predetermined position above second nitride semiconductor layer 104. Third nitride semiconductor layer 402 and hole injection electrode 403 have the same configuration as third nitride semiconductor layer 302 and hole injection electrode 303 according to Embodiment 3, respectively.

In this embodiment, as illustrated in FIG. 4A and FIG. 4B, concave recesses 104a and 104b are formed in at least parts of second nitride semiconductor layer 104 located directly under hole injection portion 401, and parts of hole injection portion 401 are disposed in recesses portions 104a and 104b. As illustrated in FIG. 4A, recesses 104a and 104b are formed to surround tapered portions 123 and 124, respectively. Stated differently, the portion of third nitride semiconductor layer 402 on the side (upside in FIG. 4A) that is farther from same-width portion 126 of second main electrode 120 than the position in the first direction in the end of tapered portion 123 at the middle of second main electrode 120 is formed on recess 104a formed in second nitride semiconductor layer 104. Recessed portion 404 of third nitride semiconductor layer 402 is disposed in recess 104a. In the same manner, the portion of third nitride semiconductor layer 402 on the side (downside in FIG. 4A) that is farther from same-width portion 126 of second main electrode 120 than the position in the first direction in the end of tapered portion 123 at the middle of second main electrode 120 is formed on recess 104a formed in second nitride semiconductor layer 104. Recessed portion 405 of third nitride semiconductor layer 402 is disposed in recess 104b.

Each of recesses 104a and 104b formed in second nitride semiconductor layer 104 is formed to have a depth greater than 0 and less than the thickness of second nitride semiconductor layer 104. Third nitride semiconductor layer 402 of hole injection portion 401 on recesses 104a and 104b includes recessed portions 404 and 405, respectively. Since the parts of hole injection portion 401 on recesses 104a and 104b have a high hole injection effect compared to the rest of hole injection portion 401, and hole injection can be further strengthened compared to Embodiment 3, trapped electrons can be further reduced.

The result of a comparative experiment on the hole injection effect according to the presence/absence of a recess structure.

Figure 4D:
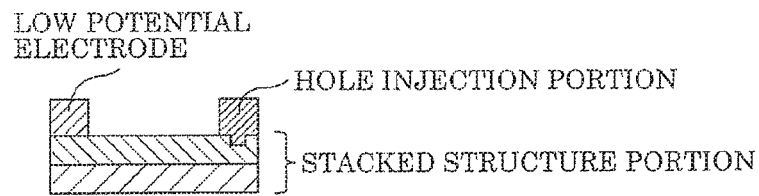
FIG. 4D is a cross-sectional view of an electrode structure having a recess, used in a comparative experiment.
Figure 4E:
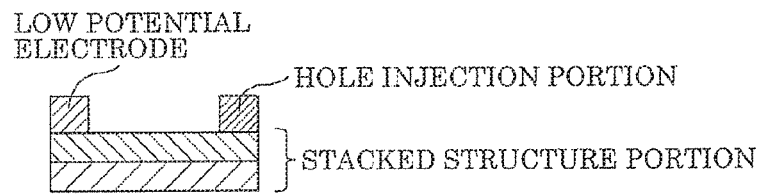
FIG. 4E is a cross-sectional view of an electrode structure that does not have a recess, used in the comparative experiment.

FIG. 4D is a cross-sectional view of an electrode structure having a recess, used in the comparative experiment. FIG. 4E is a cross-sectional view of an electrode structure that does not have a recess, used in the comparative experiment.

The electrode structure illustrated in FIG. 4D includes a stacked structure portion, a hole injection portion formed on a recess of the stacked structure portion, and a low potential electrode formed nearby. The electrode structure illustrated in FIG. 4E is different from the electrode structure illustrated in FIG. 4D in the point that a recess is not formed in the stacked structure portion, and is matching in all other points.

Figure 4F:
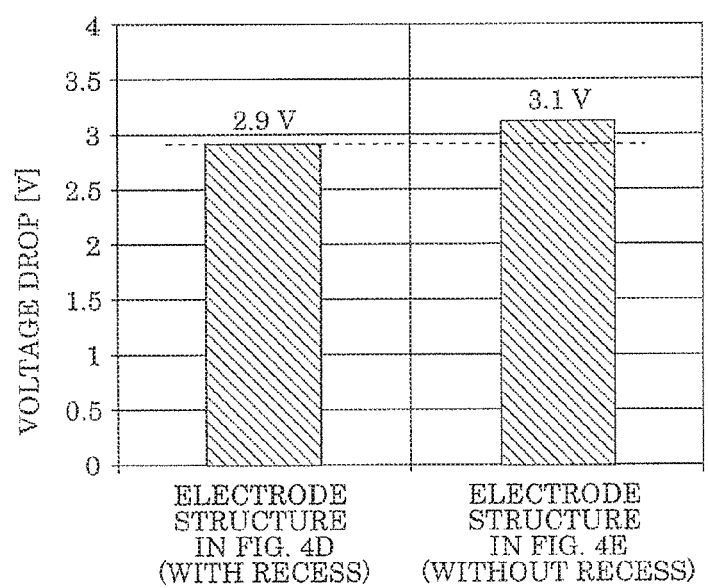
FIG. 4F is a graph illustrating the result of the comparative experiment on electron injection effect according to presence/absence of a recess.

The result of comparing applied voltage when voltage is applied to the hole injection portion of the respective electrode structures illustrated in FIG. 4D and FIG. 4E and a constant current flows will be described using the drawings. FIG. 4F is a graph illustrating the result of the comparative experiment on the electron injection effect according to the presence/absence of a recess. As illustrated in FIG. 4F, the electrode structure in FIG. 4D has a smaller value than the electrode structure in FIG. 4E. In this manner, when a recess is formed directly under the hole injection portion, it is possible to cause a larger current to flow with a smaller applied voltage. Specifically, it was understood that more holes can be injected with respect to a predetermined applied voltage when a recess is included than when a recess is not included.

It is considered that such an effect of the recess is caused by increase in the contact area between the hole injection portion and the second nitride semiconductor layer. Specifically, it is considered that, when the amount of current (hole injection amount) per unit area of the contact area is constant, the amount of current also increases with an increase in the contact area.

Embodiment 5

Hereinafter, a nitride semiconductor device according to Embodiment 5 will be described. The nitride semiconductor device according to this embodiment is different from nitride semiconductor device 400 according to Embodiment 4 in the configuration of the recess. Hereinafter, the nitride semiconductor device according to this embodiment will be described with reference to the drawings, centering on the points of difference with nitride semiconductor device 400 according to Embodiment 4.

Figure 5A:
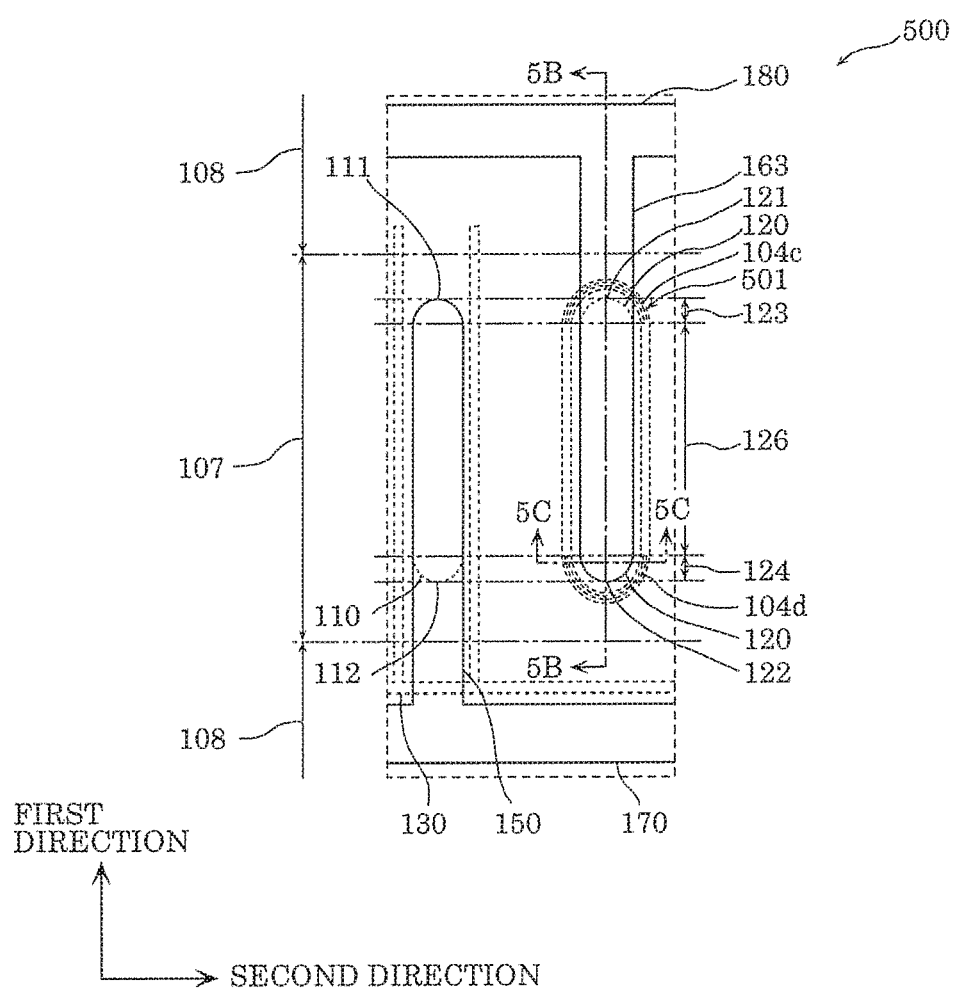
FIG. 5A is a plan view of a layout of a nitride semiconductor device according to Embodiment 5.
Figure 5B:
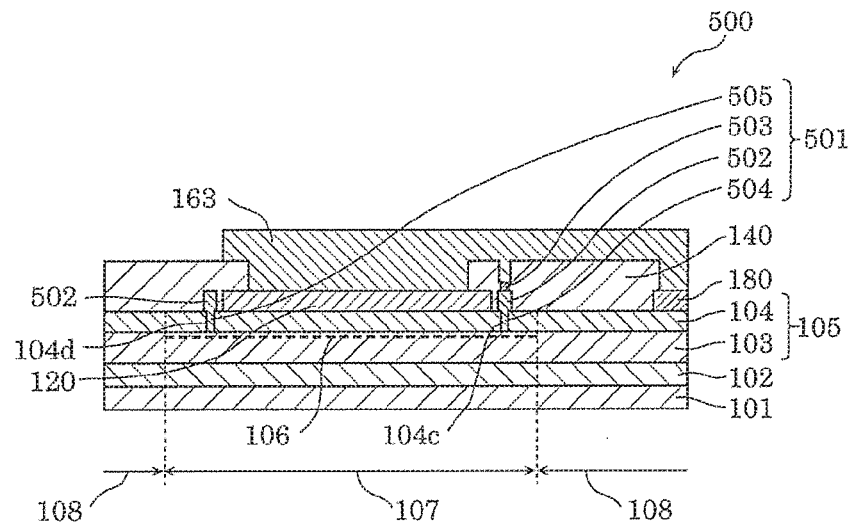
FIG. 5B is a cross-sectional view of the nitride semiconductor device according to Embodiment 5 at cross-section 5B-5B in FIG. 5A.
Figure 5C:
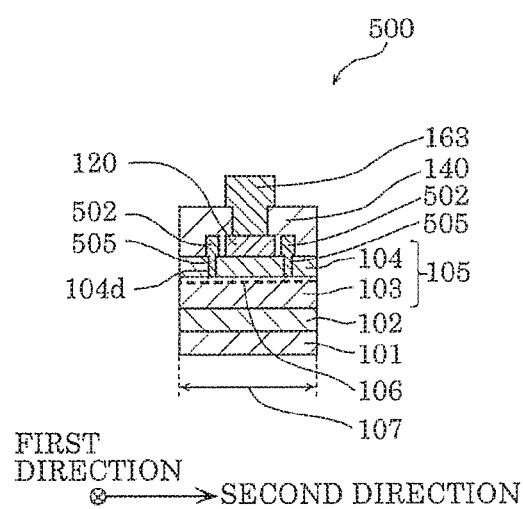
FIG. 5C is a cross-sectional view of the nitride semiconductor device according to Embodiment 5 at cross-section 5C-5C in FIG. 5A.

FIG. 5A is a plan view of a layout of nitride semiconductor device 500 according to this embodiment. FIG. 5B is a cross-sectional view of nitride semiconductor device 500 according to this embodiment at cross-section 5B-5B in FIG. 5A. FIG. 5C is a cross-sectional view of nitride semiconductor device 500 according to this embodiment at cross-section 5C-5C in FIG. 5A.

Nitride semiconductor device 500 according to this embodiment includes hole injection portion 501 surrounding second main electrode 120 in the same manner as nitride semiconductor device 400 according to Embodiment 4.

Hole injection portion 501 is disposed in the vicinity of second main electrode 120 between first main electrode 110 and second main electrode 120. Hole injection portion 501 is configured of both the p-type third nitride semiconductor layer 502 formed at a predetermined position above second nitride semiconductor layer 104, and hole injection electrode 503 formed above third nitride semiconductor layer 502. It should be noted that hole injection portion 501 may be configured of only the p-type third nitride semiconductor layer 502 formed at a predetermined position above second nitride semiconductor layer 104. Third nitride semiconductor layer 502 and hole injection electrode 503 have the same configuration as third nitride semiconductor layer 202 and hole injection electrode 203 according to Embodiment 2, respectively.

As illustrated in FIG. 5A and FIG. 5B, in this embodiment, penetrating recesses 104c and 104d which penetrate through second nitride semiconductor layer 104 are formed in at least parts of second nitride semiconductor layer 104 located directly below hole injection portion 501, and parts of hole injection portion 501 are formed inside penetrating recesses 104c and 104d. As illustrated in FIG. 5A, penetrating recesses 104c and 104d are formed to surround tapered portions 123 and 124, respectively. Stated differently, the portion of third nitride semiconductor layer 502 on the side (upside in FIG. 5A) that is farther from same-width portion 126 of second main electrode 120 than the position in the first direction in the end of tapered portion 123 at the middle of second main electrode 120 is formed on penetrating recess 104c formed in second nitride semiconductor layer 104. Recessed portion 504 of third nitride semiconductor layer 502 is disposed in penetrating recess 104c. In the same manner, the portion of third nitride semiconductor layer 502 on the side (downside in FIG. 5A) that is farther from same-width portion 126 of second main electrode 120 than the position in the first direction in the end of tapered portion 123 at the middle of second main electrode 120 is formed on penetrating recess 104d formed in second nitride semiconductor layer 104. Recessed portion 505 of third nitride semiconductor layer 502 is disposed in penetrating recess 104d. Penetrating recesses 104c and 104d are, for example, formed by completely removing second nitride semiconductor layer 104 by etching. By forming parts of hole injection portion 501 in such penetrating recesses 104c and 104d, in this embodiment, compared to Embodiment 4, the contact area between second nitride semiconductor layer 104 and third nitride semiconductor layer 502 becomes wider and hole injection can be strengthened, and thus trapped electrons can further reduced.

Furthermore, it is considered that, since 2 DEG is eliminated in a biasless state in the penetrating recess regions, electron current ceases to flow, and current flow is significantly reduced even at the time of switching illustrated by the dotted line in FIG. 8. Therefore, the destruction at the vicinity of the tip portion of second main electrode 120 tends to occur even less.

Embodiment 6

Hereinafter, a nitride semiconductor device according to Embodiment 6 will be described. The nitride semiconductor device according to this embodiment is different from nitride semiconductor device 100 according to Embodiment 1 in the point of being able to operate as a diode without including a control electrode. Hereinafter, the nitride semiconductor device according to this embodiment will be described with reference to the drawings.

Figure 6A:
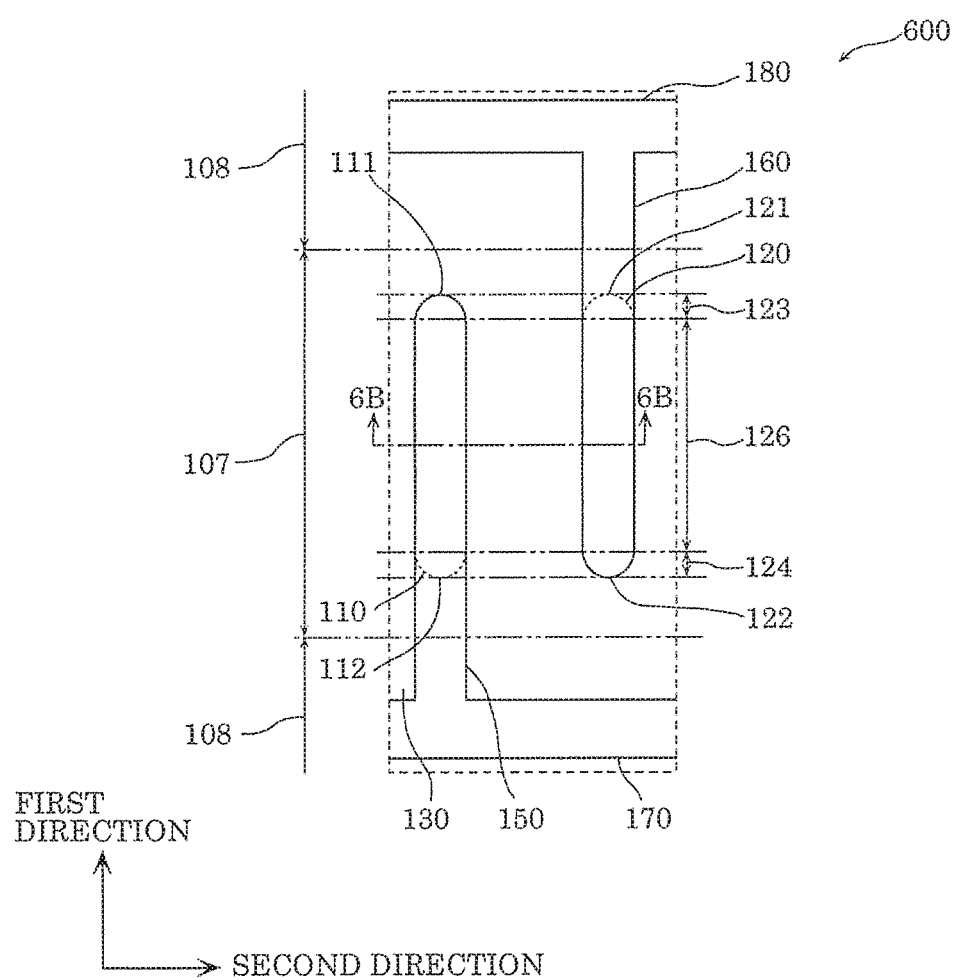
FIG. 6A is a plan view of a layout of a nitride semiconductor device according to Embodiment 6.
Figure 6B:
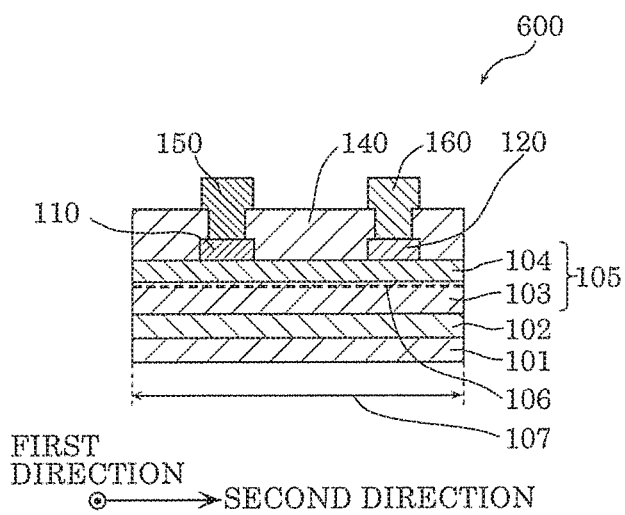
FIG. 6B is a cross-sectional view of the nitride semiconductor device according to Embodiment 6 at cross-section 6B-6B in FIG. 6A.

FIG. 6A is a plan view of a layout of nitride semiconductor device 600 according to this embodiment. FIG. 6B is a cross-sectional view of nitride semiconductor device 600 according to this embodiment at cross-section 6B-6B in FIG. 6A.

As illustrated in FIG. 6A, nitride semiconductor device 600 according to this embodiment is different from nitride semiconductor device 100 according to Embodiment 1 mainly in the point of not including control electrode 130.

Since the configuration is the same as in Embodiment 1 from substrate 101 up to second opposite-side tip 122, their descriptions will be omitted.

In this embodiment, first main electrode 110 is configured of a stacked body including Ni, TiN, W, etc., which is, for example, a metal forming a second nitride semiconductor and a Schottky junction, instead of being configured of a stacked body including Ti, Al, etc., for example.

By having such a configuration, nitride semiconductor device 600 can operate as a Schottky barrier diode having first main electrode 110 as an anode and second main electrode 120 as a cathode.

Figure 6C:
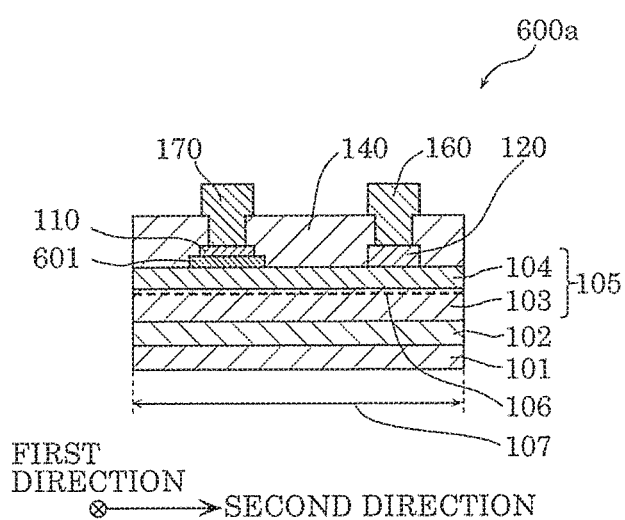
FIG. 6C is a cross-sectional view of a nitride semiconductor device according to a modification of Embodiment 6.
Figure 7:
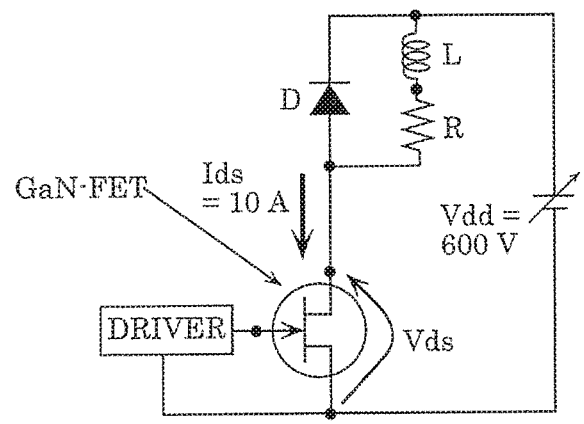
FIG. 7 is a circuit diagram illustrating a configuration of a circuit used in a continuous hard switching test of a GaN-FET.

Furthermore, in Embodiment 6, in order to realize the function of a p-n junction diode, instead of changing the electrode material of first main electrode 110, p-type semiconductor layer 601 may be formed between second nitride semiconductor layer 104 and first main electrode 110. A cross-sectional view of nitride semiconductor device 600a according to such a modification of Embodiment 6 is illustrated in FIG. 6C. FIG. 6C illustrates a cross-section of nitride semiconductor device 600a corresponding to cross-section 6B-6B in FIG. 6A.

By having such a configuration, nitride semiconductor device 600a can operate as a p-n junction diode having first main electrode 110 as an anode and second main electrode 120 as a cathode.

In the diode, the electron current flowing from the anode to the cathode at the time when the diode is OFF causes electrons to be trapped in the vicinity of the tip of the cathode electrode, which can cause destruction. By using this embodiment, it is possible to realize a diode with a long lifespan in which destruction in the vicinity of the tip of the cathode electrode is suppressed. In particular, since the density of the electron current flowing from the anode to the cathode of the diode is greater than the density of the electron current flowing from the source electrode to the drain electrode in a typical FET, the effect of suppressing destruction caused by trapped electrons becomes more prominent in nitride semiconductor device 600 according to this embodiment than in the case of an FET.

Modifications, Etc.

Although nitride semiconductor devices according to the present disclosure have been described based on exemplary embodiments thus far, the present disclosure is not limited to the respective embodiments described above.

For example, the hole injection portion according to Embodiments 2 to 5 may be applied to nitride semiconductor device 100d according to a modification of Embodiment 1 or nitride semiconductor device 600 described in Embodiment 6.

Although a normally ON transistor which conducts electricity even when bias voltage is not applied to control electrode 130 for the respective nitride semiconductor devices according to Embodiments 1 to 5, the respective nitride semiconductor devices may be a normally OFF transistor which does not conduct electricity when bias current is not applied to control electrode 130. It should be noted that, in a normally ON transistor, the density of electron current from the first main electrode to the second main electrode is higher than in the case of a normally OFF transistor. As such, when the nitride semiconductor devices in the respective embodiments is applied to a normally ON transistor, the effect of suppressing damage caused by trapped electrons is more prominent.

Furthermore, although the hole injection portion continuously surrounds the entirety of second main electrode 120 in the nitride semiconductor device according to Embodiments 3 to 5, the hole injection portion may be partially disconnected. The hole injection portion may be disconnected by approximately 1 μm which is the distance that electrons scatter. Furthermore, the hole injection portion need not be formed in portions located in the first direction with respect to second main electrode 120. Furthermore, the position at which a recess and a penetrating recess are formed is not particularly limited. For example, a recess and a penetrating recess may be formed at a position in the third nitride semiconductor layer which corresponds to the entirety of the hole injection portion.

Furthermore, although the plan view shape of the first main electrode is elliptical in the respective drawings, the shape of the first main electrode is not particularly limited, and may be rectangular for example. Furthermore, although the second main electrode includes tapered portion 124 in one of its ends in the respective drawings, tapered portion 124 need not necessarily be included. For example, the second main electrode may include a rectangular end portion in place of tapered portion 124.

Aside from the above, forms obtained by various modifications to the respective exemplary embodiments that can be conceived by a person of skill in the art as well as forms realized by arbitrarily combining structural components and functions in the respective exemplary embodiments which are within the scope of the essence of the present disclosure are included in the present disclosure.

INDUSTRIAL APPLICABILITY

A nitride semiconductor device according to this disclosure is useful as a transistor or a diode used in an inverter, a power conditioner, a power supply circuit, etc.

What is claimed is:

1. A nitride semiconductor device comprising:
   a substrate;
   a stacked structure portion including a first nitride semiconductor layer disposed above the substrate, and a second nitride semiconductor layer disposed above the first nitride semiconductor layer and having a band gap larger than a band gap of the first nitride semiconductor layer, the stacked structure portion having an active region in which two-dimensional electron gas is present, the two-dimensional electron gas being induced at an interface between the first nitride semiconductor layer and the second nitride semiconductor layer;
   a first main electrode disposed above the active region and extending in a first direction in a plan view of the substrate;
   a second main electrode disposed at a position which is above the active region and separated from the first main electrode in a second direction perpendicular to the first direction in the plan view of the substrate, the second main electrode extending in the first direction; and
   a lead-out line disposed above the second main electrode and electrically connected to the second main electrode, the lead-out line extending from a top of the second main electrode to one side in the first direction,
   wherein the first main electrode has a first tip at an end in the first direction which is on the one side to which the lead-out line extends,
   the second main electrode has a second tip at an end in the first direction which is on the one side to which the lead-out line extends, and has, at a second tip-side in the first direction, a tapered portion having a width in the second direction which decreases with decreasing distance to the second tip,
   the lead-out line has a region projecting in the second direction from the tapered portion in the plan view of the substrate, the region having a lower portion that is included in the active region, and
   the first tip does not project further in the first direction than the second tip.

2. The nitride semiconductor device according to claim 1, wherein the second tip projects further in the first direction than the first tip.

3. The nitride semiconductor device according to claim 1, wherein the first tip does not project further in the first direction than an end of the tapered portion which is closer to a middle portion of the second main electrode in the first direction.

4. The nitride semiconductor device according to claim 1, wherein the second main electrode has a same-width portion having a width in the second direction that is same across both ends in the first direction, and
a portion of the lead-out line which is located above the same-width portion does not project further toward the first main electrode in the second direction than the same-width portion.

5. The nitride semiconductor device according to claim 1, wherein the second main electrode has a same-width portion having a width in the second direction that is same across both ends in the first direction, and
a portion of the lead-out line which has a position in the first direction that coincides with the tapered portion does not project further toward the first main electrode in the second direction than the same-width portion.

6. The nitride semiconductor device according to claim 1, wherein the second main electrode has a same-width portion having a width in the second direction that is same across both ends in the first direction,
a portion of the lead-out line which extends further in a direction away from the second main electrode than the second tip and covers the active region does not project further toward the first main electrode in the second direction than the same-width portion, and
the lead-out line does not project further in the first direction than a tip of the second main electrode which on a side opposite to a side of the first tip.

7. The nitride semiconductor device according to claim 3, wherein the second main electrode has a same-width portion having a width in the second direction that is same across both ends in the first direction, and
at least part of a portion of the lead-out line which does not project further than the same-width portion and projects further than the first main electrode in the first direction projects toward the first main electrode in the second direction.

8. The nitride semiconductor device according to claim 1, wherein the second main electrode has a same-width portion having a width in the second direction that is same across both ends in the first direction, and at least part of a portion of the lead-out line which projects further than the same-width portion and does not project further than the second main electrode in the first direction projects toward the first main electrode in the second direction.

9. The nitride semiconductor device according to claim 1, wherein at least part of a portion of the lead-out line which is above the active region and projects further in the first direction than the second main electrode projects toward the first main electrode in the second direction.

10. The nitride semiconductor device according to claim 1, further comprising a hole injection portion which is disposed above the active region, in a vicinity of the second main electrode, and injects holes into the stacked structure portion.

11. The nitride semiconductor device according to claim 10, wherein the hole injection portion surrounds the second main electrode in the plan view of the substrate.

12. The nitride semiconductor device according to claim 10, wherein at least part of the second nitride semiconductor layer located directly below the hole injection portion includes a recess that is concave, and part of the hole injection portion is disposed in the recess.

13. The nitride semiconductor device according to claim 10, wherein at least part of the second nitride semiconductor layer located directly below the hole injection portion includes a penetrating recess that penetrates through the second nitride semiconductor layer, and part of the hole injection portion is disposed in the recess.

* * * * *